(12) United States Patent
Yamamoto

(10) Patent No.: US 8,212,151 B2
(45) Date of Patent: Jul. 3, 2012

(54) WIRING SUBSTRATE AND SEMICONDUCTOR PACKAGE

(75) Inventor: Takayuki Yamamoto, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 256 days.

(21) Appl. No.: 12/471,802

(22) Filed: May 26, 2009

(65) Prior Publication Data

US 2009/0296364 A1    Dec. 3, 2009

(30) Foreign Application Priority Data

May 28, 2008    (JP) ................................. 2008-138910

(51) Int. Cl.
*H05K 1/00* (2006.01)
(52) U.S. Cl. ...................................................... 174/258
(58) Field of Classification Search .................. 174/258, 174/250, 255; 257/737, 779; 361/764
See application file for complete search history.

(56) References Cited

U.S. PATENT DOCUMENTS

| | | | |
|---|---|---|---|
| 6,217,988 B1* | 4/2001 | Yasue et al. ..................... 428/209 |
| 6,228,466 B1* | 5/2001 | Tsukada et al. ............... 428/209 |
| 6,710,260 B1* | 3/2004 | Seki et al. ....................... 174/258 |
| 7,948,085 B2* | 5/2011 | Shih et al. ....................... 257/758 |
| 2007/0164349 A1* | 7/2007 | Nakasato et al. ............ 257/318 |
| 2009/0296364 A1* | 12/2009 | Yamamoto .................... 361/820 |
| 2010/0173455 A1* | 7/2010 | Shiota ............................ 438/113 |

FOREIGN PATENT DOCUMENTS

| JP | 2000-031628 | | 1/2000 |
| JP | 2002-043723 A | | 2/2002 |
| JP | 2006-165303 | * | 6/2006 |

OTHER PUBLICATIONS

Office Action dated Mar. 13, 2012 in the corresponding Japanese Patent Application No. 2008-138910.

* cited by examiner

*Primary Examiner* — Neil Abrams
(74) *Attorney, Agent, or Firm* — Drinker Biddle & Reath LLP

(57) ABSTRACT

A wiring substrate includes: an insulating layer; a wiring formed on the insulating layer; and a solder resist layer formed on the insulating layer so as to cover at least a portion of the wiring, the solder resist layer being constituted by a plurality of layers, wherein the plurality of layers contain fillers of different grain diameters, a layer thickness of an innermost layer for constituting the plurality of layers is thicker than a layer thickness of the wiring, and a grain diameter of the filler contained in the innermost layer is smaller than a shortest interval between adjacent lines of the wiring.

13 Claims, 37 Drawing Sheets

WIRING SUBSTRATE AND SEMICONDUCTOR PACKAGE

BACKGROUND OF THE INVENTION

The present invention relates to a wiring substrate and a semiconductor package, and more particularly to a wiring substrate having a solder resist layer constituted by a plurality of layers, as well as a semiconductor package having the same.

For example, in a semiconductor package in which a semiconductor chip is mounted on a wiring substrate having built-up wirings, a solder resist layer is formed as an outermost layer of the wiring substrate. A photo solder resist which is photosensitive is generally used as the solder resist layer. In addition, the solder resist layer is generally formed as a two-layered structure for forming a layer of a sufficient thickness.

FIG. 1 is a cross-sectional view partially illustrating a conventional semiconductor package. A semiconductor package 200 has a wiring substrate 100, a semiconductor chip 210, and an underfill resin 220. The wiring substrate 100 has an insulating layer 130, a wiring 140, a solder resist layer 150, and a metal layer 160. The solder resist layer 150 is constituted by two layers, an inner layer 150a and an outer layer 150b. The inner layer 150a and the outer layer 150b constituting the solder resist layer 150 contain a filler 170.

In the wiring substrate 100, the wiring 140 is formed on the insulating layer 130, and the solder resist layer having openings 150x for partially exposing the wiring 140 is further formed thereon. The metal layer 160 is formed in the openings 150x of the solder resist layer 150. The metal layer 160 is electrically connected to the wiring 140.

The semiconductor chip 210 has ball-like terminals 210a. In the semiconductor chip 210, a semiconductor integrated circuit (not shown) and electrode pads (not shown) are formed on a semiconductor substrate (not shown) formed of silicon or the like into a thin plate, and the ball-like terminals 210a serving as electrodes are formed on the electrode pads (not shown). The ball-like terminals 210a of the semiconductor chip 210 are electrically connected to the metal layer 160 of the wiring substrate 100. The underfill 220 is filled between the semiconductor chip 210 and the solder resist layer 150.

FIG. 2 is a cross-sectional view partially illustrating the semiconductor package shown in FIG. 1. In FIG. 2, those components that are identical to those shown in FIG. 1 will be denoted by the same reference numerals, and a description will be omitted in some cases. Reference character P1 denotes a shortest interval of the wiring 140. Symbol φ1 denotes the grain diameter of the filler 170. It should be noted that the grain diameter refers to a maximum grain diameter. Namely, the grain diameter refers to a longest portion in the dimensions of the filler. For example, if the filler is spherical, the grain diameter means its diameter, whereas if the cross section of the filler is elliptical, the grain diameter means its major axis. In addition, in a case where a plurality of fillers are present, the grain diameter refers to a maximum grain diameter among them.

The inner layer 150a and the outer layer 150b constituting the solder resist layer 150 contain the filler 170 with the grain diameter of φ1. The filler 170 is contained in the solder resist layer 150 for purposes of such as the optimization of the viscosity of the solder resist layer 150, improvement of its printability, improvement of its water resistance, and prevention of the occurrence of cracks. The grain diameter φ1 of the filler 170 is smaller than the shortest interval P1 of the wiring 140. The grain diameter φ1 of the filler 170 is, for example, 20 μm, and the shortest interval P1 of the wiring 140 is, for example, 30 μm (e.g., see patent document 1).

[Patent Document 1] JP-A-2000-31628

However, with increased miniaturization and thinning of the semiconductor package 200, the pitch of the wiring 140 is becoming narrow. FIG. 3 is a cross-sectional view illustrating a state in which the pitch of the wiring shown in FIG. 2 has become narrow. In FIG. 3, those components that are identical to those shown in FIG. 2 will be denoted by the same reference numerals, and a description will be omitted in some cases. Reference character P2 denotes a shortest interval of the wiring 140.

If the wiring 140 becomes increasingly narrower in pitch, the grain diameter φ1 of the filler 170 becomes larger than the shortest interval P2 of the wiring 140, so that there can be cases where the filler 170 is present at a position of being in contact with the wiring 140.

Incidentally, there are cases where water enters the solder resist layer 150 from the outside, if, in such a state, a voltage is applied to the wiring substrate 100 for constituting the semiconductor package 200, a so-called migration can possibly occur in which a metal such as Cu constituting the wiring 140 is ionized and recrystallized.

Since water is likely to enter the inner layer 150a through an interface between the filler 170 and the inner layer 150a, if the filler 170 is present at a position of being in contact with the adjacent wiring 140, the ionization of the metal such as Cu constituting the wiring 140 is accelerated when the migration has occurred. The ionized metal easily moves into the inner layer 150a along the interface between the filler 170 and the inner layer 150a and recrystallizes, so that the dielectric resistance between adjacent lines of the wiring 140 declines precipitously, leading to electrical shortcircuiting between the adjacent lines of the wiring 140.

Thus, in the wiring substrate 100 for constituting the conventional semiconductor package 200, there are cases where the grain diameter φ1 of the filler 170 contained in the solder resist layer 150 is larger than the shortest interval P2 of the wiring 140 covered by the solder resist layer 150. For this reason, there has been a problem in that the migration progresses due to the presence of the filler 170.

In addition, if the grain diameter φ1 of the filler 170 contained in the solder resist layer 150 is made smaller than the shortest interval P2 of the wiring 140 to overcome the above-described problem, there has been a problem in that it becomes impossible to attain the intended purposes of containing the filler 170, i.e., the optimization of the viscosity of the solder resist layer 150, improvement of its printability, improvement of its water resistance, and prevention of the occurrence of cracks.

The invention has been devised in view of the above-described circumstances, and its object is to provide a wiring substrate and a semiconductor package which are capable of preventing the progress of the migration while sufficiently attaining the intended purposes of containing the filler.

To attain the above object, according to a first aspect of the invention there is provided a wiring substrate including:

an insulating layer;

a wiring formed on the insulating layer; and a solder resist layer formed on the insulating layer so as to cover at least a portion of the wiring, the solder resist layer being constituted by a plurality of layers, wherein the plurality of layers contain fillers of different grain diameters, a layer thickness of an innermost layer for constituting the plurality of layers is thicker than a layer thickness of the wiring, and a grain diameter of the filler contained in the innermost layer is smaller than a shortest interval between adjacent lines of the wiring.

According to a second aspect, there is provided the wiring substrate according to the first aspect, wherein the grain diameter of the filler contained in the innermost layer is smaller than the grain diameter of the filler contained in the other layers.

According to a third aspect, there is provided the wiring substrate according to the first or second aspect, wherein an amount of the filler contained in the innermost layer is substantially identical to an amount of the filler contained in each of the other layers.

According to a forth aspect, there is provided the wiring substrate according to any one of the first to third aspects, wherein the innermost layer is free of a secondary aggregation substance of the filler.

According to a fifth aspect, there is provided a wiring substrate including:

an insulating layer;

a wiring formed on the insulating layer; and a solder resist layer formed on the insulating layer so as to cover at least a portion of the wiring, the solder resist layer being constituted by a plurality of layers, wherein a layer thickness of an innermost layer for constituting the plurality of layers is thicker than a layer thickness of the wiring, and the innermost layer is free of the filler.

According to a sixth aspect, there is provided a semiconductor package including:

the wiring substrate according to any one of first to fifth aspects, and a semiconductor chip, wherein the semiconductor chip is electrically connected to a portion of the wiring of the wiring substrate which is exposed from the solder resist layer.

According to a seventh aspect, there is provided a semiconductor package including:

an insulating layer;

a wiring formed on the insulating layer; and a solder resist layer formed on the insulating layer so as to cover at least a portion of the wiring, the solder resist layer being constituted by a plurality of layers, wherein the plurality of layers contain fillers of different grain diameters, a layer thickness of an innermost layer for constituting the plurality of layers is thicker than a layer thickness of the wiring, and a grain diameter of the filler contained in the innermost layer is smaller than a shortest interval between adjacent lines of the wiring.

According to an eighth aspect, there is provided the semiconductor package according to the seventh aspect, wherein the grain diameter of the filler contained in the innermost layer is smaller than the grain diameter of the filler contained in the other layers.

According to a ninth aspect, there is provided the semiconductor package according to the seventh or eighth aspect, wherein an amount of the filler contained in the innermost layer is substantially identical to an amount of the filler contained in each of the other layers.

According to a tenth aspect, there is provided the semiconductor package according to any one of the seventh to ninth aspects, wherein the innermost layer is free of a secondary aggregation substance of the filler.

According to the invention, it is possible to provide a wiring substrate and a semiconductor package which are capable of preventing the progress of a migration while sufficiently attaining the intended purposes of containing the filler.

DETAILED DESCRIPTION OF THE PREFERRED EMBODIMENTS

Referring now to the accompanying drawings, a description will be given of the best mode for carrying out the invention.

First Embodiment

Figure 4:
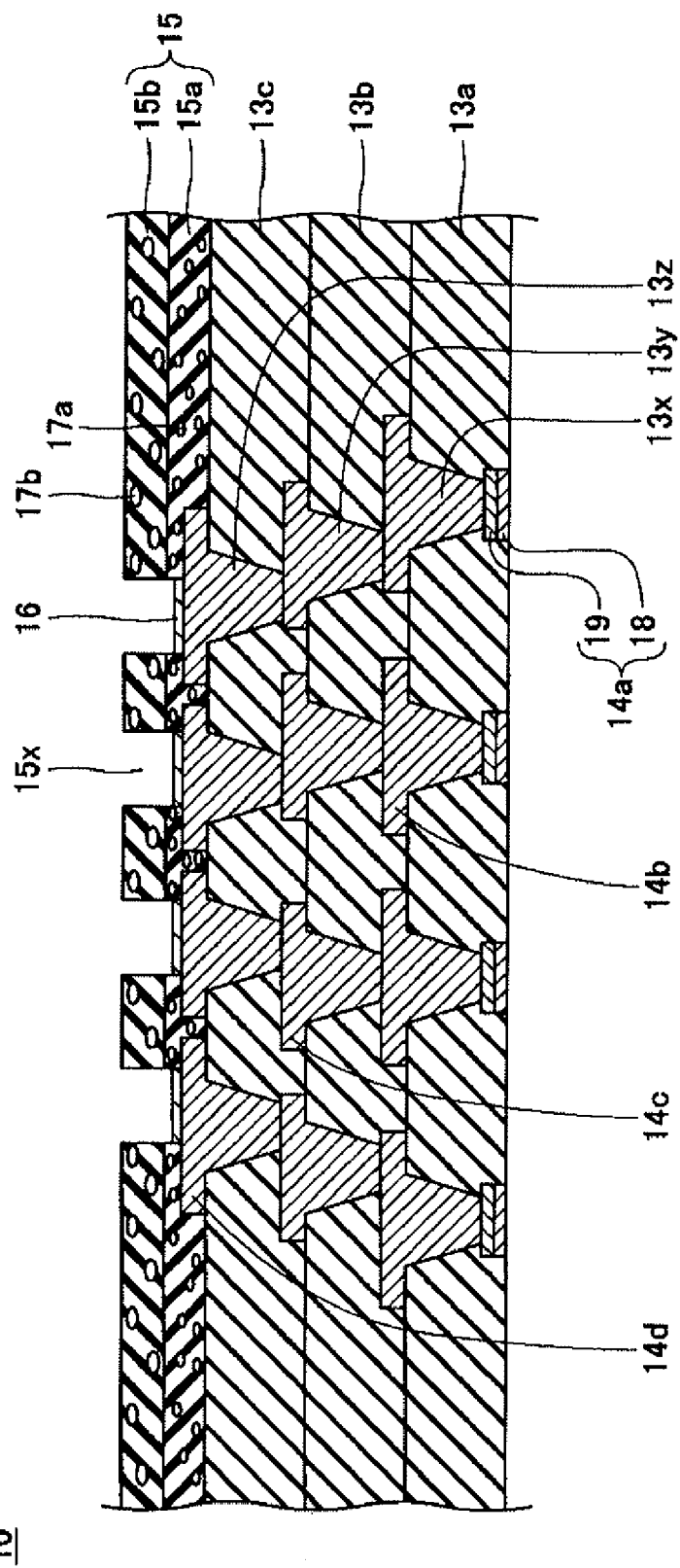
FIG. 4 is a cross-sectional view illustrating a wiring substrate having built-up wiring layers in accordance with a first embodiment of the invention.

In a first embodiment, an example is shown in which the invention is applied to a wiring substrate having a multilayered wiring layer (built-up wiring layers). FIG. 4 is a cross-sectional view illustrating a wiring substrate having built-up wiring layers in accordance with the first embodiment of the invention. Referring to FIG. 4, a wiring substrate 10 is a wiring substrate provided with built-up wiring layers including a first insulating layer 13a, a second insulating layer 13b, a third insulating layer 13c, a wiring 14a, a wiring 14b, a wiring 14c, a wiring 14d, a solder resist layer 15, and a metal layer 16.

In the wiring substrate 10, the wiring 14a is formed in a wiring layer which is a lowermost layer (hereinafter referred to as the "first wiring layer"). The first insulating layer 13a is formed so as to cover the wiring 14a, and the wiring 14b is formed on the first insulating layer 13a. Further, the second insulating layer 13b is formed so as to cover the wiring 14b, and the wiring 14c is formed on the second insulating layer 13b. Furthermore, the third insulating layer 13c is formed so as to cover the wiring 14c, and the wiring 14d is formed on the third insulating layer 13c. The wiring 14a is exposed from the first insulating layer 13a and functions as an electrode pad which is connected to a motherboard or the like.

The wiring 14a and the wiring 14b are electrically connected through a first via hole 13x. Further, the wiring 14b and the wiring 14c are electrically connected through a second via hole 13y formed in the second insulating layer 13b. Furthermore, the wiring 14c and the wiring 14d are electrically connected through a third via hole 13z formed in the third insulating layer 13c.

The solder resist layer 15 having openings 15x is formed so as to cover the wiring 14d. The solder resist layer 15 is constituted by an inner layer 15a containing a filler 17a and an outer layer 15b containing a filler 17b. The metal layer 16 is formed on the wiring 14d in the openings 15x of the solder resist layer 15. The metal layer 16 can be formed, for instance, as an Ni/Au plating layer in which an Ni plating layer and an Au plating layer are stacked in that order on the wiring 14d in each opening 15x of the solder resist layer 15.

The surface where the metal layer 16 is formed serves as a semiconductor chip mounting surface where a semiconductor chip is mounted. The metal layer 16 exposed in the opening 15x of the solder resist layer 15 functions as an electrode pad and is electrically connected to a corresponding electrode of the semiconductor chip.

Figure 5:
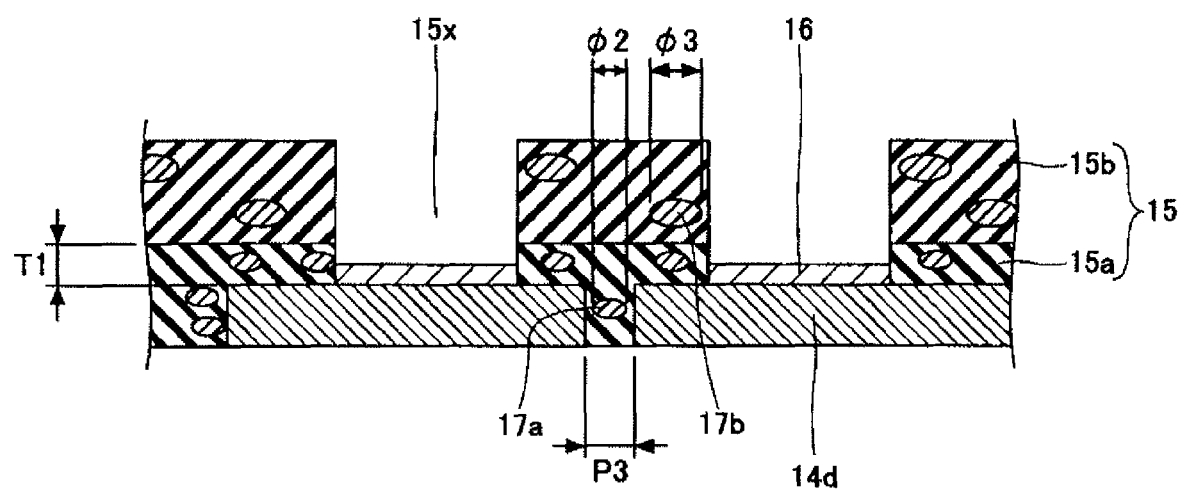
FIG. 5 is a cross-sectional view partially illustrating the wiring substrate shown in FIG. 4.

FIG. 5 is a cross-sectional view partially illustrating the wiring substrate shown in FIG. 4. In FIG. 5, those components that are identical to those shown in FIG. 4 will be denoted by the same reference numerals, and a description will be omitted in some cases. Symbol $\phi 2$ denotes the grain diameter of the filler 17a. Symbol $\phi 3$ denotes the grain diameter of the filler 17b. Reference character P3 denotes a shortest interval of the wiring 14d. Reference character T1 denotes a thickness from an upper surface of the inner layer 15a to an upper surface of the wiring 14d.

It should be noted that the grain diameter in the invention means a maximum grain diameter. Namely, the grain diameter refers to a longest portion in the dimensions of the filler. For example, if the filler is spherical, the grain diameter means its diameter, whereas if the cross section of the filler is elliptical, the grain diameter means its major axis. In addition, in a case where a plurality of fillers are present, the grain diameter refers to a maximum grain diameter among them.

The inner layer 15a for constituting the solder resist layer 15 contains the filler 17a with the grain diameter of $\phi 2$. There are cases where the filler 17a agglutinates to form a so-called secondary aggregation substance which has such as a spherical shape as a whole, in which case the grain diameter substantially becomes large. In this invention, however, since such a secondary aggregation substance is removed in advance, the inner layer 15a for constituting the solder resist layer 15 does not contain the secondary aggregation substance of the filler 17a. The thickness T1 should preferably be set larger than the grain diameter $\phi 2$ of the filler 17a.

The outer layer 15b for constituting the solder resist layer 15 contains the filler 17b with the grain diameter of φ3. The fillers 17a and 17b are respectively contained in the inner layer 15a and the outer layer 15b constituting the solder resist layer 15 for purposes of such as the optimization of the viscosity of the solder resist layer 15, improvement of its printability, improvement of its water resistance, and prevention of the occurrence of cracks.

Figure 1:
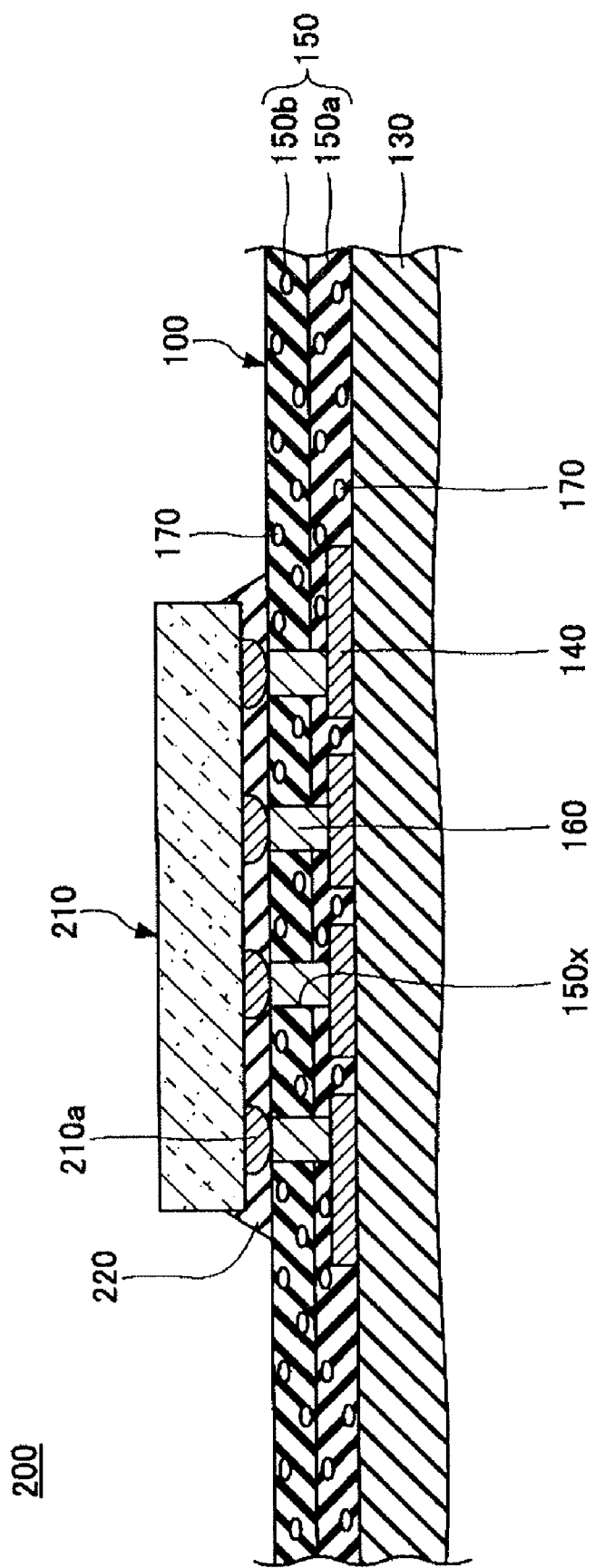
FIG. 1 is a cross-sectional view partially illustrating a conventional semiconductor package.
Figure 2:
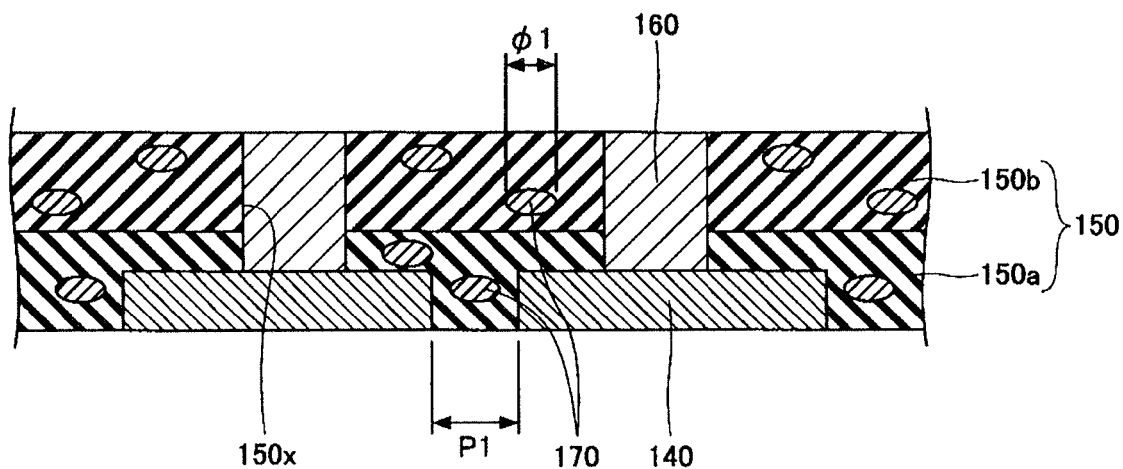
FIG. 2 is a cross-sectional view partially illustrating the semiconductor package shown in FIG. 1.
Figure 3:
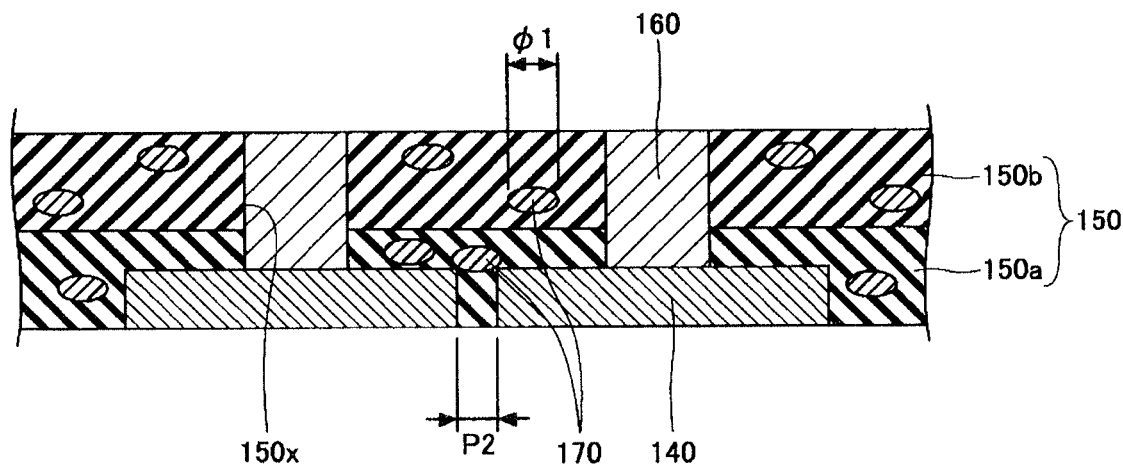
FIG. 3 is a cross-sectional view illustrating a state in which the pitch of the wiring shown in FIG. 2 has become narrow.

The grain diameter φ2 of the filler 17a is smaller than the shortest interval P3 of the wiring 14d. The grain diameter φ3 of the filler 17b may be arbitrary irrespective of the shortest interval P3 of the wiring 14d. However, in view of the purposes of such as the optimization of the viscosity of the solder resist layer 15, improvement of its printability, improvement of its water resistance, and prevention of the occurrence of cracks, the grain diameter φ3 of the filler 17b should preferably be equivalent to the grain diameter φ1 (see FIG. 2) of a filler 170 in a wiring substrate 100 for constituting a conventional semiconductor package 200.

For example, if it is assumed that the shortest interval P3 of the wiring 14d is 8 μm, the grain diameter φ2 of the filler 17a needs to be made smaller than the shortest interval P3=8 μm, and can be set to be not more than 6 μm. The grain diameter φ3 of the filler 17b may be equivalent to the grain diameter φ1 of the filler 170 in the wiring substrate 100 for constituting the conventional semiconductor package 200, and can be set to, for example, 20 μm.

It should be noted that the inner layer 15a for constituting the solder resist layer 15 may not contain the filler 17a. In that case, the purposes of such as the optimization of the viscosity of the solder resist layer 15, improvement of its printability, improvement of its water resistance, and prevention of the occurrence of cracks can be attained by the outer layer 15b containing the filler 17b.

As the inner layer 15a and the outer layer 15b for constituting the solder resist layer 15, it is possible to use, for example, a photosensitive resin composition including such as an epoxy-based resin and an imide-based resin. Further, a volatile solvent may be contained therein. As the fillers 17a and 17b, it is possible to use inorganic compounds such as silicon oxide, titanium oxide, aluminum oxide, aluminum nitride, silicon carbide, calcium titanate, and zeolite, or organic compounds, for example.

The filler 17a and the filler 17b may be formed of an identical material or may be formed of different materials. The amount of the filler 17a contained in the inner layer 15a and the amount of the filler 17b contained in the outer layer 15b may be substantially identical or may be different. The amount referred to herein is, for example, the weight (wt. %) of the filler 17a or the filler 17b with respect to the weight of the photosensitive resin composition constituting the inner layer 15a or the outer layer 15b.

Thus, the solder resist layer 15 is constituted by the inner layer 15a and the outer layer 15b. Further, the inner layer 15a contains the filler 17a with the grain diameter of φ2 smaller than the shortest interval P3 of the wiring 14d, while the outer layer 15b contains the filler 17b with the grain diameter of φ3 equivalent to that in the case of the wiring substrate 100 for constituting the conventional semiconductor package 200. As a result, even if a voltage is applied to the wiring substrate 10 in a state in which water has entered from the outside into the inner layer 15a for constituting the solder resist layer 15, and a so-called migration occurs in which a metal such as Cu constituting the wiring 14d is ionized and recrystallized owing to some factor, it is possible to prevent the progress of the migration. At the same time, it is also possible to attain the purposes of such as the optimization of the viscosity of the solder resist layer 15, improvement of its printability, improvement of its water resistance, and prevention of the occurrence of cracks.

More specifically, even if water enters the inner layer 15a from an interface between the filler 17a and the inner layer 15a, the ionization of the metal such as Cu constituting the wiring 14d is not accelerated since the filler 17a is not brought into contact with the adjacent wiring 14d, as shown in FIG. 5.

Accordingly, the ionized metal does not recrystallize when it moves into the inner layer 15a along the interface between the filler 17a and the inner layer 15a. Hence, the dielectric resistance between the adjacent lines of the wiring 14d can be maintained at a normal value, the adjacent lines of the wiring 14d are not electrically shortcircuited, and it is possible to prevent the progress of the migration.

Next, a description will be given of the method of manufacturing the wiring substrate 10. FIGS. 6 to 18 are diagrams illustrating the process of manufacturing the wiring substrate in accordance with the first embodiment of the invention. In FIGS. 6 to 18, those components that are identical to those shown in FIGS. 4 and 5 will be denoted by the same reference numerals, and a description will be omitted in some cases.

Figure 6:
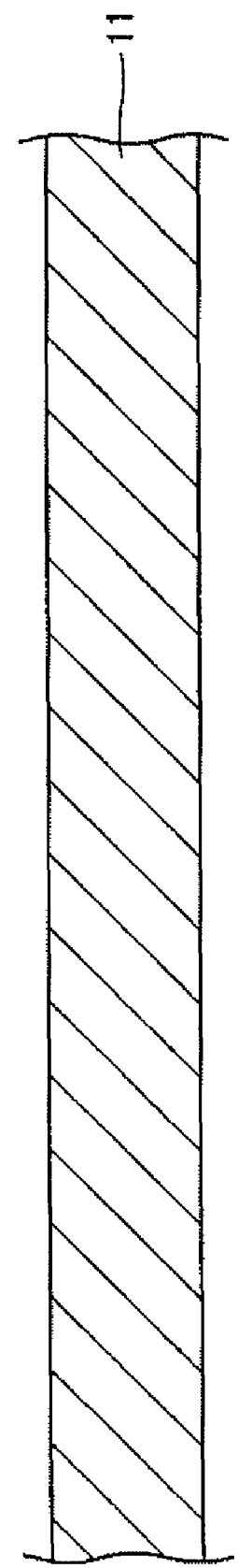
FIG. 6 is a diagram (step 1) illustrating the process of manufacturing the wiring substrate in accordance with the first embodiment of the invention.
Figure 7:
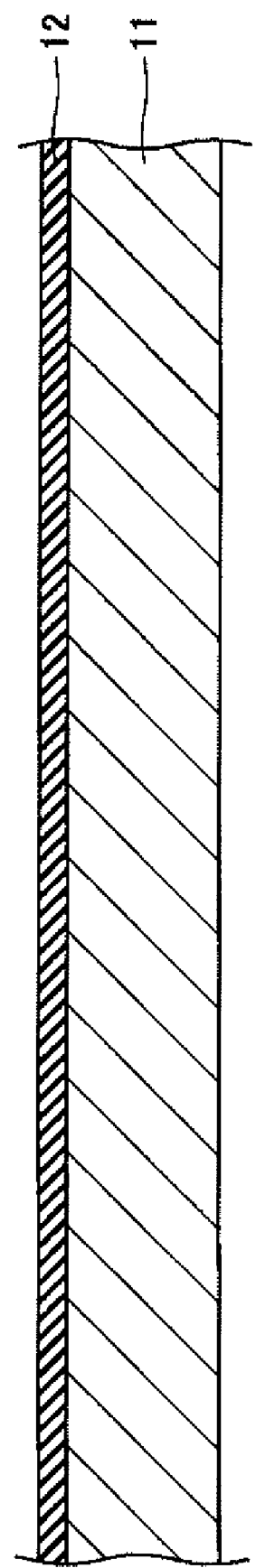
FIG. 7 is a diagram (step 2) illustrating the process of manufacturing the wiring substrate in accordance with the first embodiment of the invention.

First, a support 11 is prepared in the step shown in FIG. 6. In this embodiment, a copper foil is used as the support 11. The thickness of the copper foil can be set to, for example, 35 to 100 μm. Next, in the step shown in FIG. 7, a resist film 12 is formed on the support 11. As the resist film 12, it is possible to use, for example, a dry film or the like.

Figure 8:
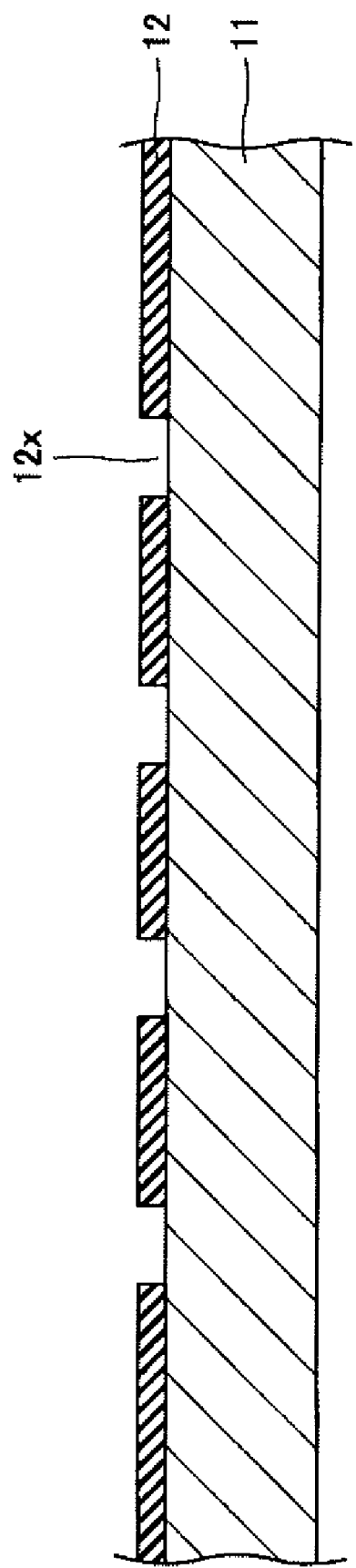
FIG. 8 is a diagram (step 3) illustrating the process of manufacturing the wiring substrate in accordance with the first embodiment of the invention.

Next, in the step shown in FIG. 8, the resist film 12 is subjected to patterning processing to form openings 12x in portions corresponding to the positions where the wiring 14a is to be formed. It should be noted that the openings 12x may be formed in advance in the resist film 12 in a dry film state, and the resist film 12 with the openings 12x formed therein may be disposed on the support 11.

Figure 9:
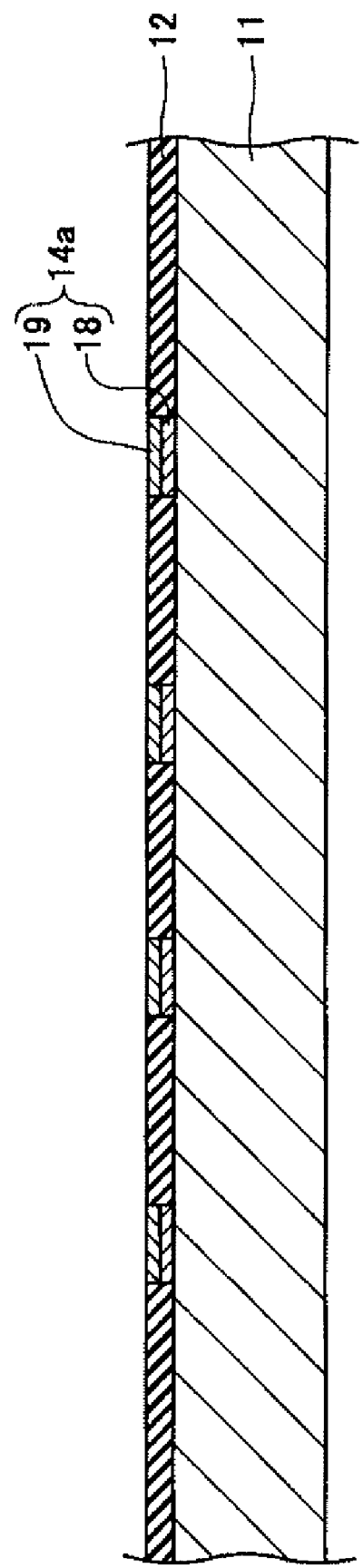
FIG. 9 is a diagram (step 4) illustrating the process of manufacturing the wiring substrate in accordance with the first embodiment of the invention.
Figure 10:
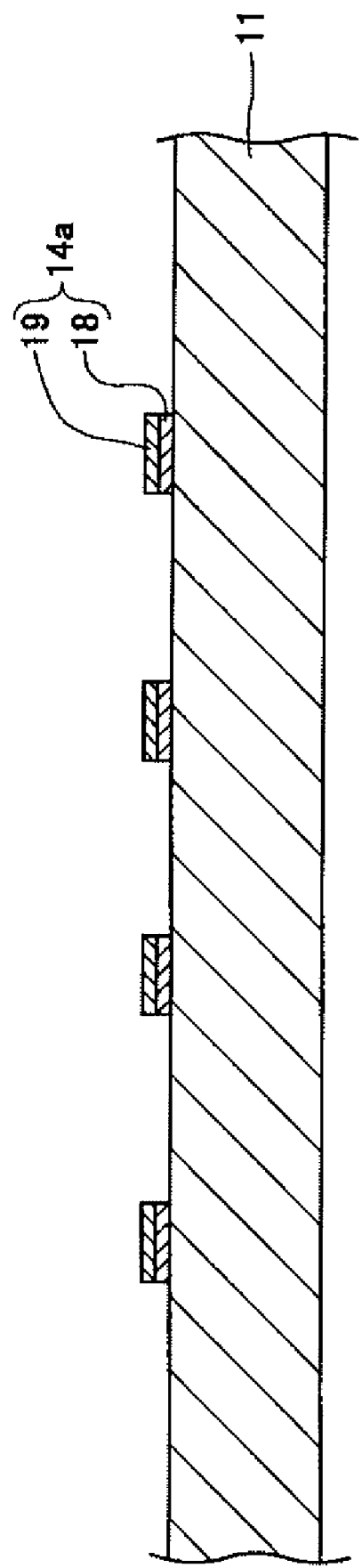
FIG. 10 is a diagram (step 5) illustrating the process of manufacturing the wiring substrate in accordance with the first embodiment of the invention.

Next, in the step shown in FIG. 9, the wiring 14a is formed on the first wiring layer on the support 11 by such as an electrolytic plating process in which the support 11 is used as a plating feeder layer. The wiring 14a is formed in the openings 12x formed in the resist film 12, and is constituted by a surface plating layer 18 and a pad body 19.

The surface plating layer 18 has a structure in which, for example, an Au film, a Pd film, and an Ni film are consecutively laminated in that order. Hence, to form the wiring 14a, the surface plating layer 18 is first formed by consecutively performing plating with the Au film, the Pd film, and the Ni film, and the pad body 19 made of Cu or the like is then formed on the surface plating layer 18. Next, the resist film 12 shown in FIG. 9 is removed in the step shown in FIG. 10.

Figure 11:
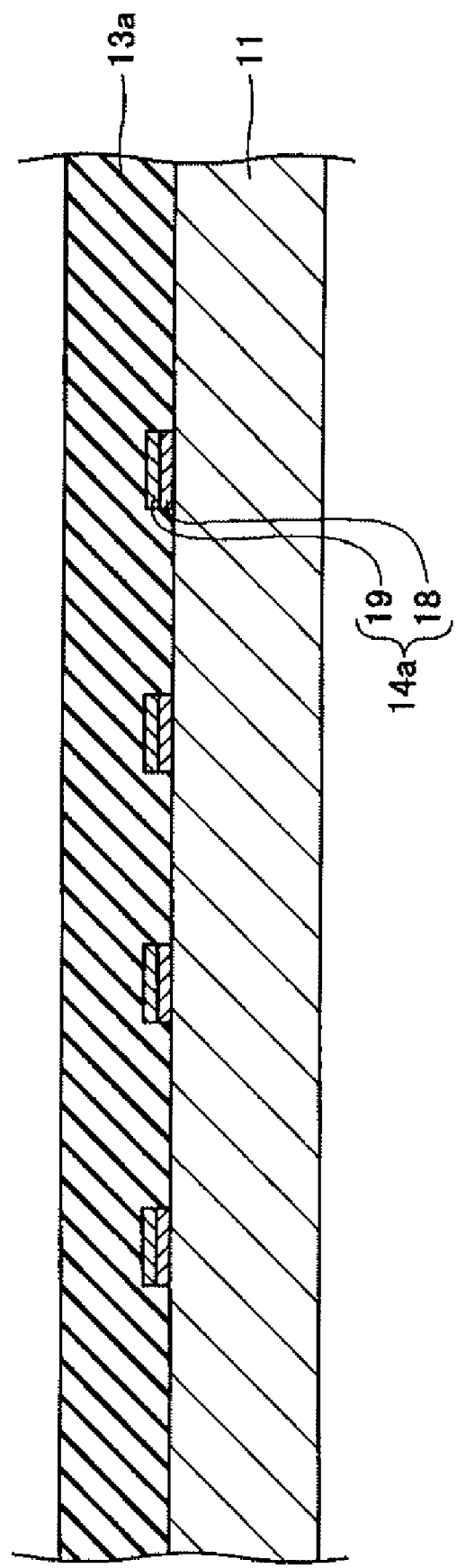
FIG. 11 is a diagram (step 6) illustrating the process of manufacturing the wiring substrate in accordance with the first embodiment of the invention.

Next, in the step shown in FIG. 11, the first insulating layer 13a for covering the wiring 14a is formed on the support 11. As the material of the first insulating layer 13a, it is possible to use a resin material such as an epoxy-based resin, a polyimide-based resin, or the like. As an example of the method of forming the first insulating layer 13a, after a resin film is laminated on the support 11, the resin film is pressed and is subsequently subjected to heat treatment at a temperature of 190° C. or thereabouts so as to be cured, thereby making it possible to obtain the first insulating layer 13a.

Figure 12:
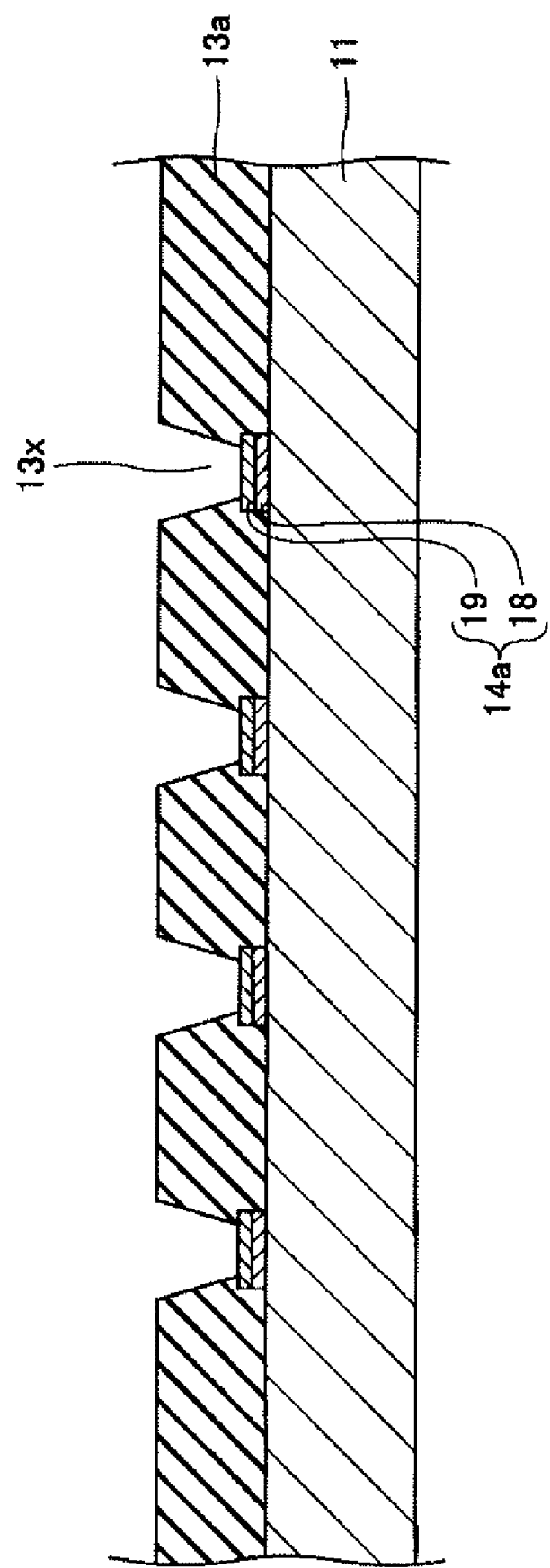
FIG. 12 is a diagram (step 7) illustrating the process of manufacturing the wiring substrate in accordance with the first embodiment of the invention.

Next, in the step shown in FIG. 12, the first via holes 13x are formed by using a laser processing method or the like so as to allow the wiring 14a to be exposed on the first insulating layer 13a formed on the support 11. It should be noted that a method may alternatively used in which a photosensitive resin film is used as the first insulating layer 13a and is subjected to patterning by photolithography to form the first via holes 13x. Still alternatively, a method may be used in which a resin film provided with openings by screen printing is subjected to patterning to form the first via holes 13x.

Figure 13:
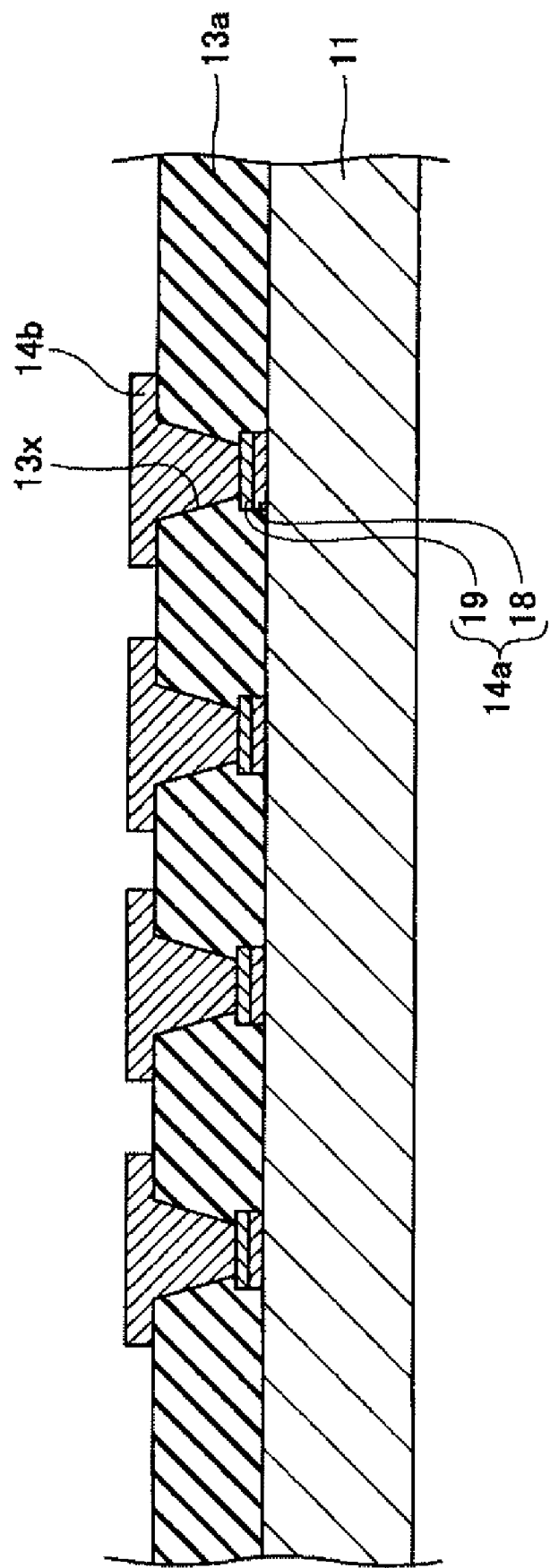
FIG. 13 is a diagram (step 8) illustrating the process of manufacturing the wiring substrate in accordance with the first embodiment of the invention.

Next, in the step shown in FIG. 13, the wiring 14b, which is connected to the wiring 14a, i.e., the first wiring layer, through the respective first via hole 13x, is formed on the first insulating layer 13a. As the wiring 14b, it is possible to use, for example, copper (Cu) or the like. The wiring 14b is formed by a semi-additive process, for example.

A more detailed description will be given of an example of forming the wiring 14b by the semi-additive process. First, after a Cu seed layer (not shown) is formed in the first via holes 13x and on the first insulating layer 13a by an electroless plating process or a sputtering process, a resist film (not shown) having openings corresponding to the wiring 14b is formed. Next, a Cu layer pattern (not shown) is formed in the openings of the resist film by an electrolytic plating process in which the Cu seed layer is used as a plating feeder layer.

Subsequently, after re moving the resist film, the Cu seed layer is subjected to etching by using the Cu layer pattern as a mask to thereby obtain the wiring 14b. It should be noted that, as the method of forming the wiring 14b, it is possible to use various wiring forming methods such as a subtractive process in addition to the aforementioned semi-additive process.

Figure 14:
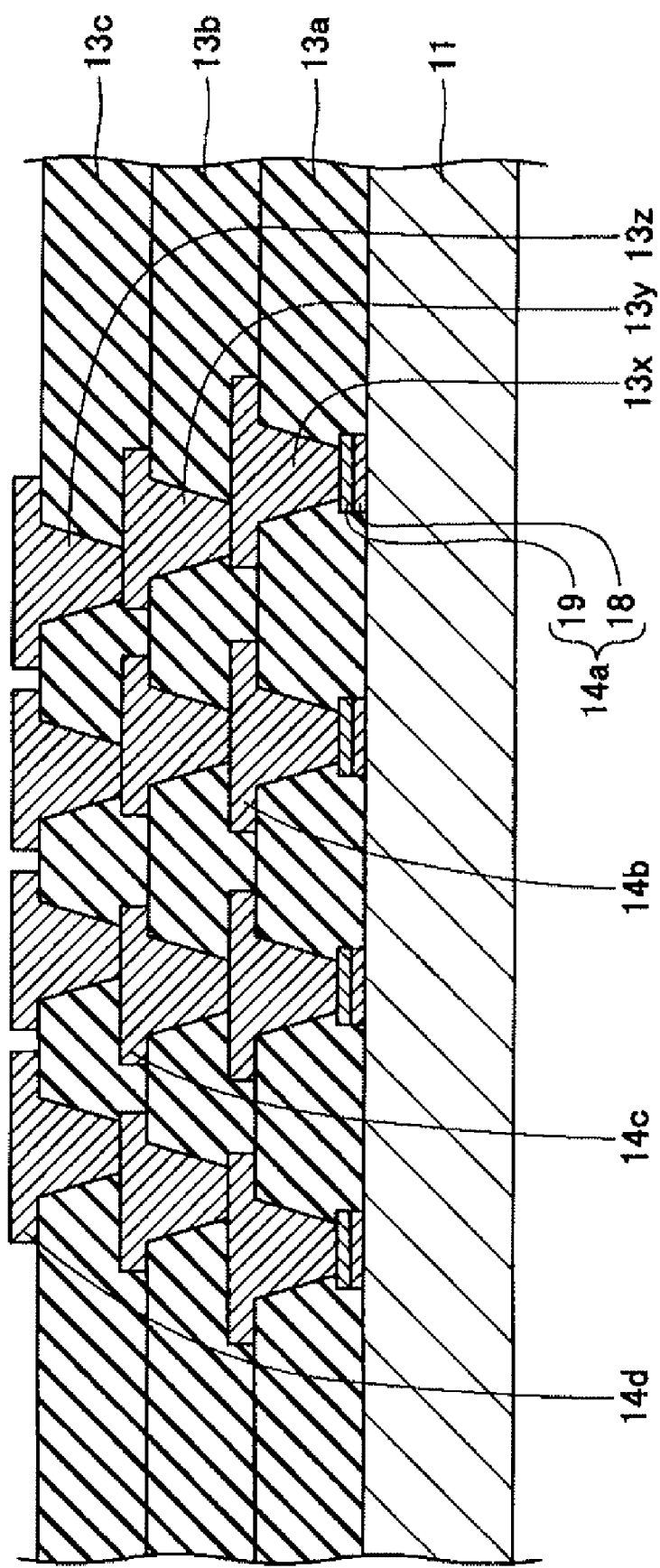
FIG. 14 is a diagram (step 9) illustrating the process of manufacturing the wiring substrate in accordance with the first embodiment of the invention.

Next, in the step shown in FIG. 14, the first to fourth wiring layers (wirings 14a to 14d) and the inner layers 13a to 13c are laminated by repeating the steps similar to those described above. Namely, after the second insulating layer 13b for covering the wiring 14b of the second wiring layer is formed on the first insulating layer 13a and the second wiring layer (wiring 14b), the second via holes 13y are formed in the portions of the second insulating layer 13b over the wiring 14b.

Further, the wiring 14c, which constitutes the third wiring layer and is connected to the wiring 14b through the respective second via holes 13y, is formed on the second insulating layer 13b. As the wiring 14c, it is possible to use, for example, copper (Cu) or the like. The wiring 14c is formed by the semi-additive process, for example.

Furthermore, after the third insulating layer 13c for covering the wiring 14c is formed, the third via holes 13z are formed in the portions of the third insulating layer 13c over the wiring 14c. Still further, the wiring 14d, which constitutes the fourth wiring layer and is connected to the wiring 14c through the respective third via hole 13z, is formed on the third insulating layer 13c. As the wiring 14d, it is possible to use, for example, copper (Cu) or the like. The wiring 14d is formed by the semi-additive process, for example.

Thus, predetermined built-up wiring layers are formed on the first wiring layer on the support 11. Although in this embodiment four built-up wiring layers (first to fourth wiring layers) are formed, n-layered (n is an integer of 2 or more) built-up wiring layers may be formed.

Figure 15:
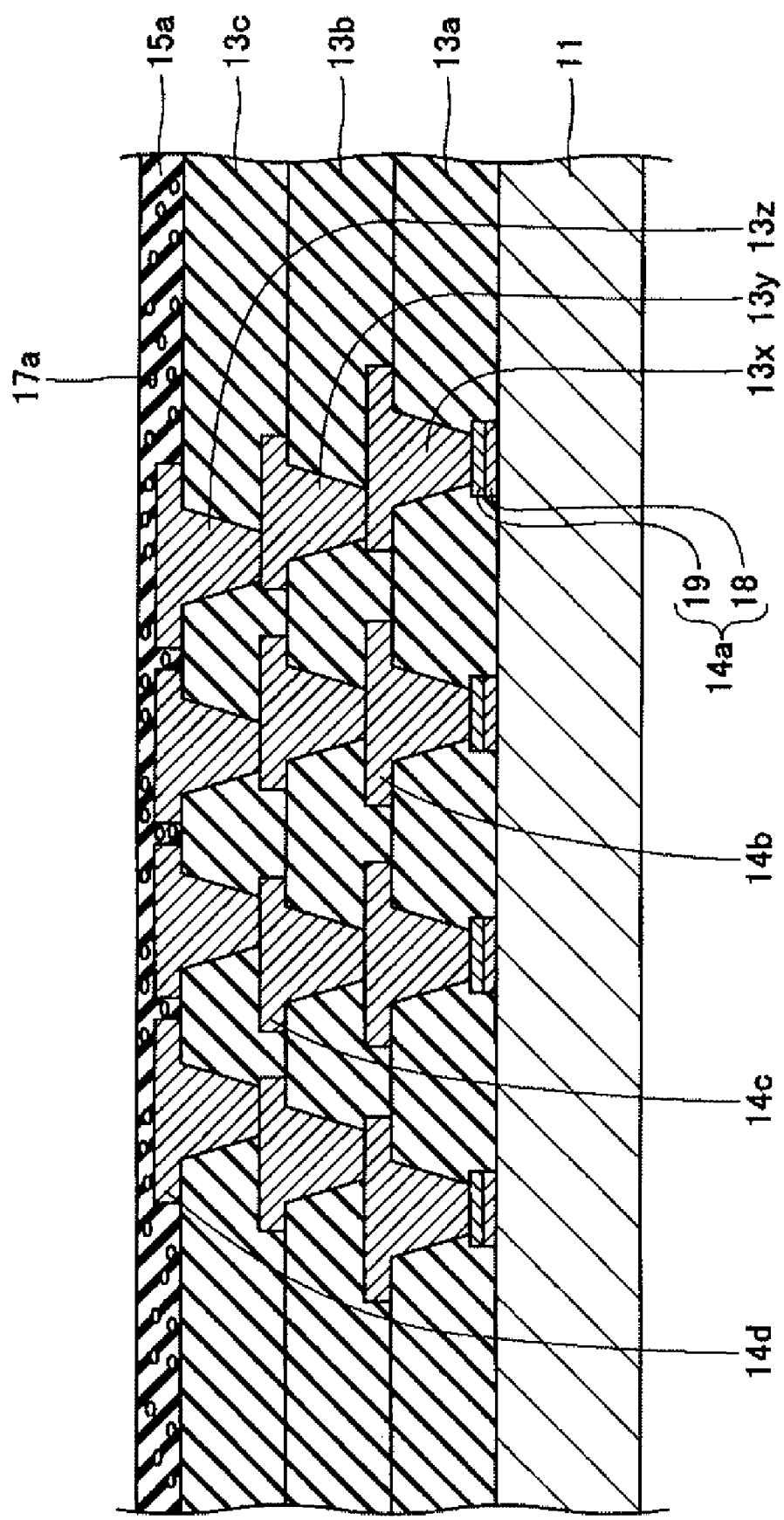
FIG. 15 is a diagram (step 10) illustrating the process of manufacturing the wiring substrate in accordance with the first embodiment of the invention.

Next, in the step shown in FIG. 15, a solder resist containing the filler 17a whose grain diameter is $\phi 2$ is applied onto the third insulating layer 13c so as to cover the wiring 14d, thereby forming the inner layer 15a for constituting the solder resist layer 15. As the inner layer 15a, it is possible to use, for example, a photosensitive resin composition including such as an epoxy-based resin and an imide-based resin. Further, a volatile solvent may be contained therein. As the filler 17a, it is possible to use an inorganic compound such as silicon oxide, titanium oxide, aluminum oxide, aluminum nitride, silicon carbide, calcium titanate, and zeolite, or an organic compound, for example.

Figure 16:
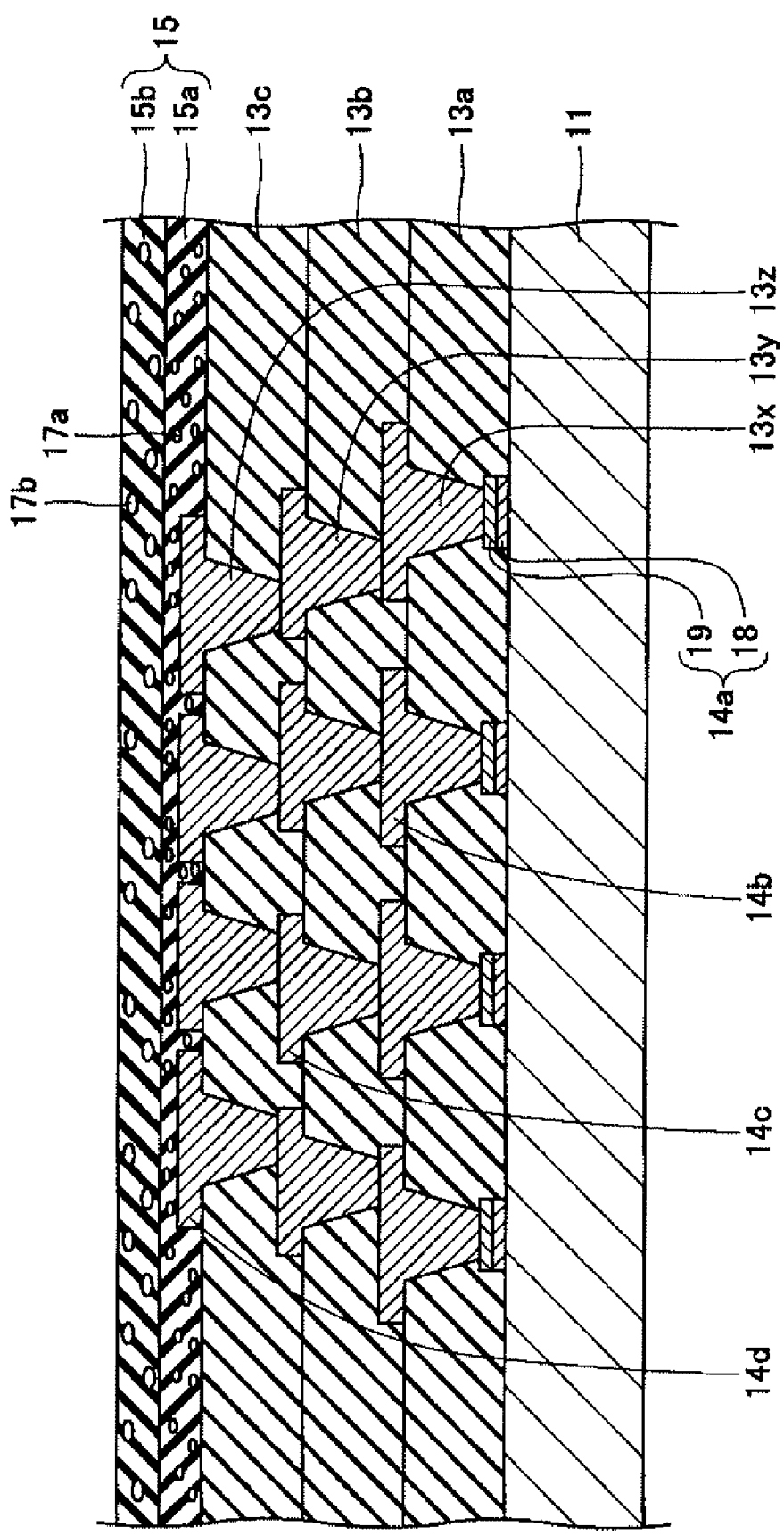
FIG. 16 is a diagram (step 11) illustrating the process of manufacturing the wiring substrate in accordance with the first embodiment of the invention.

Next, in the step shown in FIG. 16, a solder resist containing the filler 17b whose grain diameter is $\phi 3$ is applied onto the inner layer 15a, thereby forming the outer layer 15b for constituting the solder resist layer 15. As the outer layer 15b, it is possible to use, for example, a photosensitive resin composition including such as an epoxy-based resin and an imide-based resin.

Further, a volatile solvent may be contained in the outer layer 15b. As the filler 17b, it is possible to use an inorganic compound such as silicon oxide, titanium oxide, aluminum oxide, aluminum nitride, silicon carbide, calcium titanate, and zeolite, or an organic compound, for example. The solder resist layer 15 which is constituted by the inner layer 15a and the outer layer 15b is thereby formed.

Figure 17:
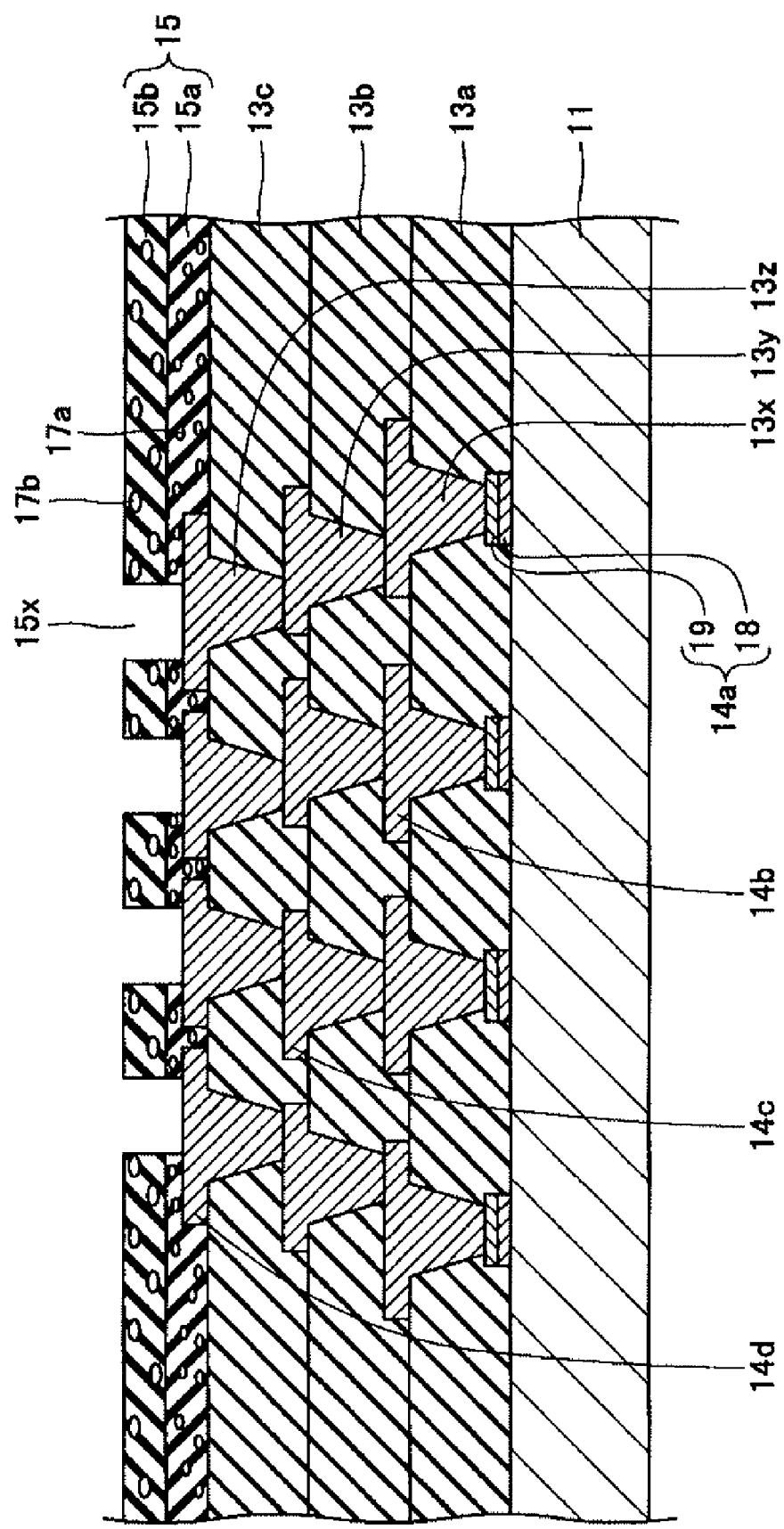
FIG. 17 is a diagram (step 12) illustrating the process of manufacturing the wiring substrate in accordance with the first embodiment of the invention.

Next, in the step shown in FIG. 17, the solder resist layer 15 is subjected to exposure and development to thereby form the openings 15x. Consequently, the wiring 14d is exposed in the openings 15x of the solder resist layer 15. Next, in the step shown in FIG. 18, the metal layer 16 is formed on the wiring 14d in the openings 15x of the solder resist layer 15. The metal layer 16 can be formed, for instance, as an Ni/Au plating layer in which an Ni plating layer and an Au plating layer are stacked in that order on the wiring 14d in each opening 15x of the solder resist layer 15. The metal layer 16 serves as an electrode pad which is connected to the semiconductor chip or the like.

Figure 18:
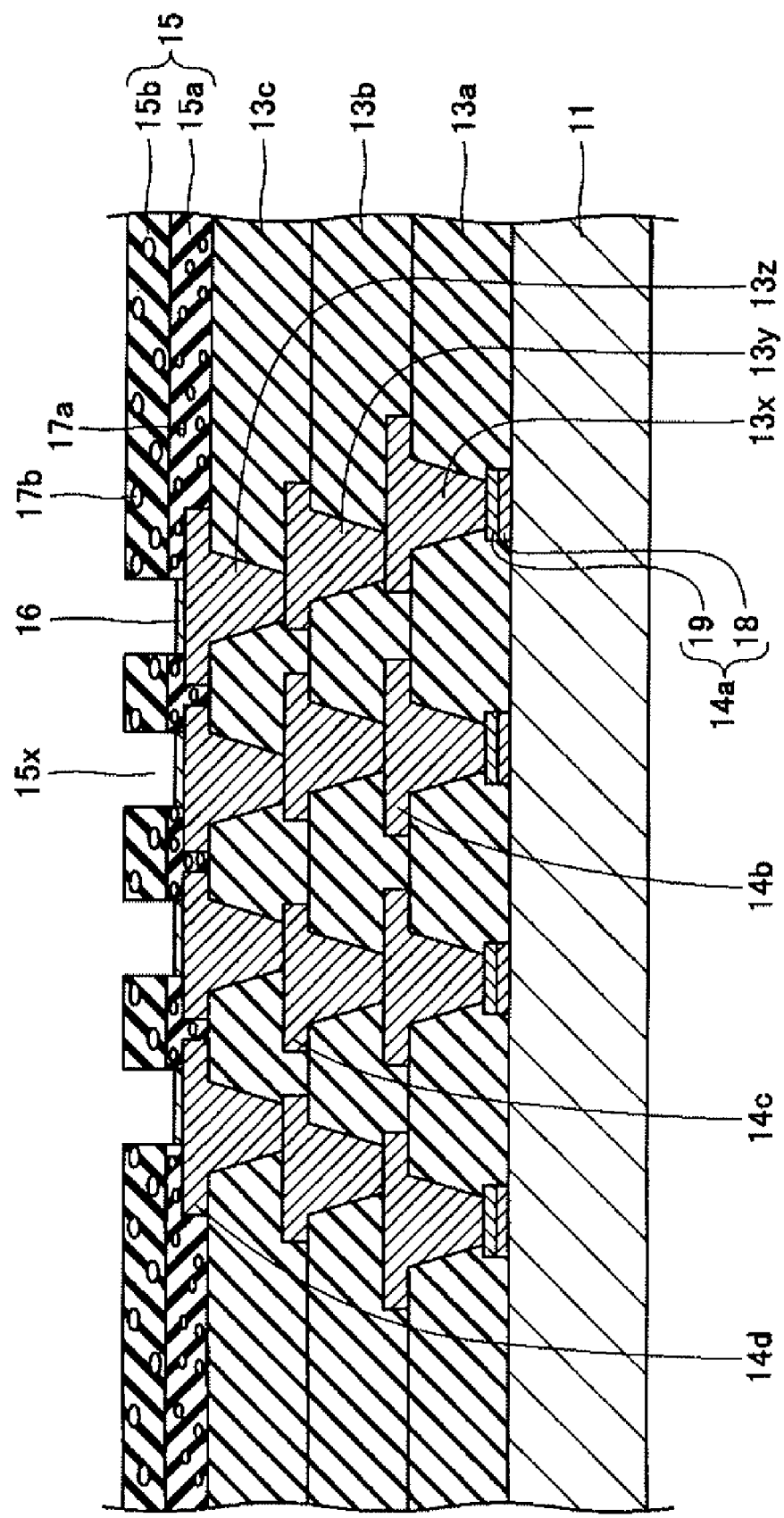
FIG. 18 is a diagram (step 13) illustrating the process of manufacturing the wiring substrate in accordance with the first embodiment of the invention.

Next, the support 11 shown in FIG. 18 is removed, and the wiring substrate 10 in accordance with the first embodiment of the invention shown in FIG. 4 is thereby manufactured. The removal of the support 11 can be effected by wet etching using aqueous ferric chloride, aqueous cupric chloride, aqueous ammonium persulfate, or the like. At this juncture, since the surface plating layer 18 is formed on the outermost surface of the wiring 14a, the support 11 can be removed by being selectively subjected to etching with respect to the wiring 14a. Consequently, the wiring 14a is exposed from the first insulating layer 13a and function as an electrode pad which is connected to the motherboard or the like.

Subsequently, an HAST test is conducted as an experiment for confirming whether or not the progress of migration differs between the case where a filler (corresponding to the filler 17a in FIG. 5) having a smaller grain diameter than the shortest interval of the wiring is contained in the solder resist layer and the case where a filler (corresponding to the filler 17b in FIG. 5) having a larger grain diameter than the shortest interval of the wiring is contained therein.

TABLE 1

| Sample for Evaluation | Photosensitive Resin Composition | Grain Diameter |
|---|---|---|
| 1 | A | large |
| 2 | A | small |
| 3 | B | large |
| 4 | B | small |

First, 10 pieces are prepared for each of the four kinds of samples for evaluation 1 to 4 shown in Table 1. The samples for evaluation 1 to 4 shown in Table 1 are those in which a wiring having a predetermined comb-shaped pattern is formed on a substrate and is covered with a photosensitive resin composition containing a filler with a predetermined grain diameter. In the samples for evaluation 1 to 4, the wiring is formed of Cu, the predetermined interval (corresponding to P3 in FIG. 5) of the wiring is 8 μm, the width of the wiring is 8 μm, and the thickness of the wiring is 12 μm.

As the photosensitive resin compositions, two kinds including the photosensitive resin composition A and the photosensitive resin composition B having a higher insulating property than the photosensitive resin composition A are prepared. The photosensitive resin composition A and the photosensitive resin composition B are both epoxy-based resin. The thickness of each photosensitive resin composition is set to 15 µm. In Table 1, the term "large" as to the grain diameter of the filler means that the grain diameter of the filler is larger than the interval of the wiring, whereas the term "small" as to the grain diameter of the filler means that the grain diameter of the filler is smaller than the interval of the wiring.

Namely, in the sample for evaluation 1, the wiring is covered with the photosensitive resin composition A containing a filler with a larger grain diameter than the interval of the wiring. In the sample for evaluation 2, the wiring is covered with the photosensitive resin composition A containing a filler with a smaller grain diameter than the interval of the wiring.

In the sample for evaluation 3, the wiring is covered with the photosensitive resin composition B containing a filler with a larger grain diameter than the interval of the wiring. In the sample for evaluation 4, the wiring is covered with the photosensitive resin composition B containing a filler with a smaller grain diameter than the interval of the wiring.

Figure 19:
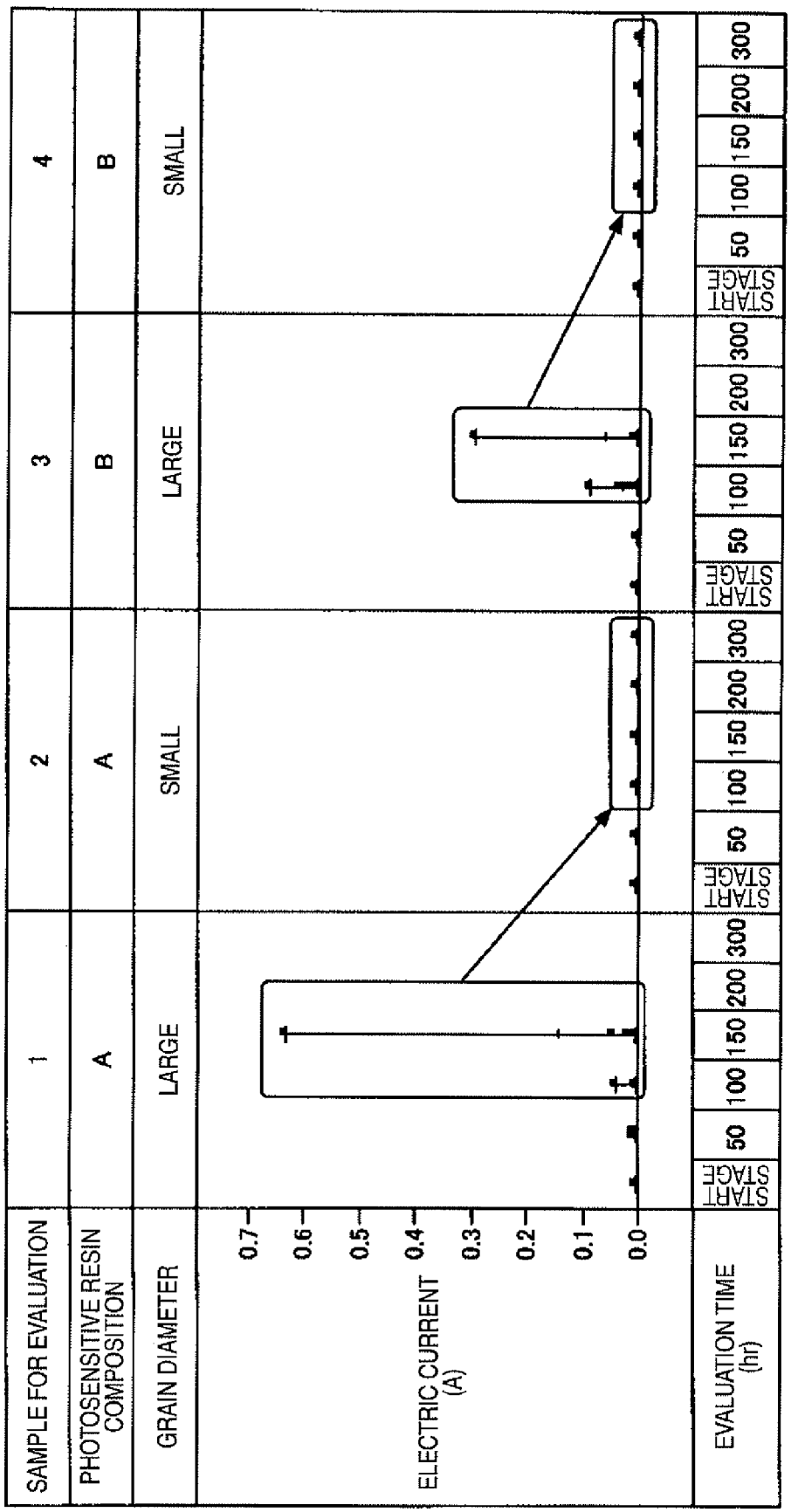
FIG. 19 is a diagram illustrating the results of an HAST test.

Next, an HAST test (Highly Accelerated Stress Test) is conducted. The test conditions are 130° C., 85 RH, and application of 5V. With respect to the same for evaluations 1 to 4, an electric current flowing across the adjacent wiring lines is confirmed after 50, 100, 150, 200, and 300 hours after the test start. FIG. 19 is a diagram illustrating the results of the HAST test.

In FIG. 19, the abscissa is the evaluation time (hr), and the ordinate is the electric current (A). The electric current (A) is calculated from a resistance value ($\Omega$) and numerically expresses the degree of deterioration of the insulating property. As described above, 10 pieces are prepared for each of the four kinds of samples for evaluation 1 to 4 shown in Table 1. In FIG. 19, the respective 10 pieces of data are measured for the same for evaluations 1 to 4 at each evaluation time and are plotted.

As shown in FIG. 19, if a comparison is made between the same for evaluation 1 and the same for evaluation 2, it can be understood that, in the case of the same for evaluation 2, the electric current practically did not change even with the lapse of the evaluation time. Similarly, if a comparison is made between the same for evaluation 3 and the same for evaluation 4, it can be understood that, in the case of the same for evaluation 4, the electric current practically did not change even with the lapse of the evaluation time.

Namely, it is confirmed that even if the same photosensitive resin composition is used, the progress of migration can be prevented by allowing the filler with a smaller grain diameter than the interval of the wiring to be contained in the photosensitive resin composition. It should be noted that if a comparison is made between the same for evaluation 1 and the same for evaluation 3, the change in the electric current is smaller in the case of the same for evaluation 3 even with the lapse of the evaluation time. This is conceivably due to the fact that the insulating property of the resin per se of the photosensitive resin composition B is higher than that of the photosensitive resin composition A.

Figure 20:
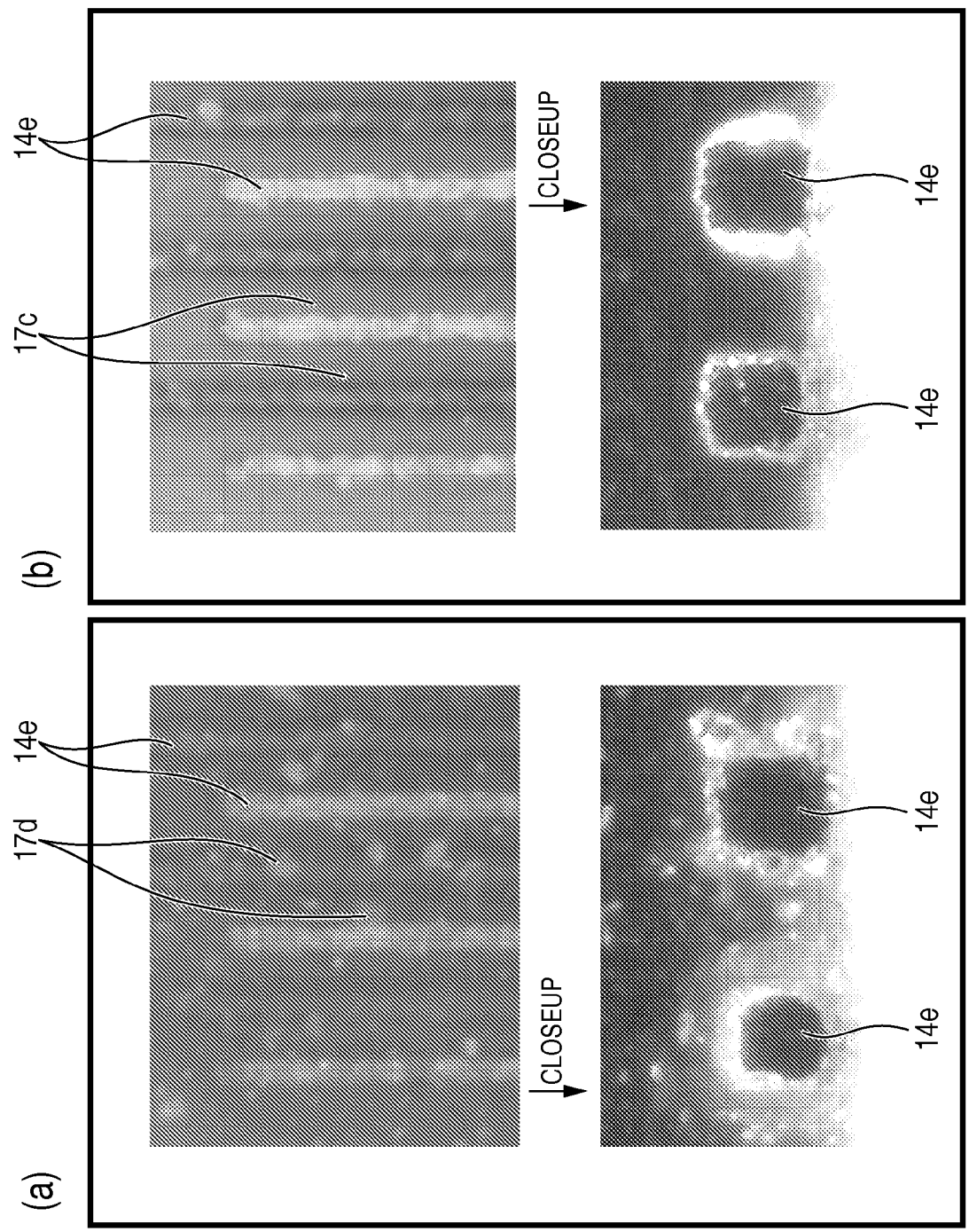
FIGS. 20A and 20B are diagrams illustrating the external appearance of same for evaluations after the HAST test.

FIGS. 20A and 20B are diagrams illustrating the external appearance of the same for evaluations after the HAST test. In FIGS. 20A and 20B, reference numeral 14e denotes the wiring; 17C denotes a filler with a smaller grain diameter than the interval of the wiring 14e; and 17d denotes a filler with a larger grain diameter than the interval of the wiring 14e. FIG. 20A shows the external appearance of the same for evaluation 1 after 300 hours of the evaluation time, and FIG. 20B shows the external appearance of the same for evaluation 2 after 300 hours of the evaluation time.

In FIGS. 20A and 20B, the upper side is a plan view, and the lower side is a cross-sectional view. As shown in FIG. 20A, in the case where the photosensitive resin composition contains the filler 17d with a larger grain diameter than the interval of the wiring 14e, the ionized Cu recrystallizes in the surroundings of the filler 17d. For this reason, the distance between the lines of the wiring 14e artificially becomes narrow and leads to the deterioration of insulation.

As shown in FIG. 20B, in the case where the photosensitive resin composition contains the filler 17c with a smaller grain diameter than the interval of the wiring 14e, the recrystallization such as the one shown in FIG. 20A cannot be confirmed. For this reason, the distance between the lines of the wiring 14e does not artificially become narrow and does not lead to the deterioration of insulation. Thus, it is confirmed from FIGS. 20A and 20B that even if the same photosensitive resin composition is used, the progress of migration can be prevented by allowing the filler with a smaller grain diameter than the interval of the wiring to be contained in the photosensitive resin composition.

According to the wiring substrate 10 in accordance with the above-described first embodiment of the invention, the solder resist layer 15 is constituted by the inner layer 15a and the outer layer 15b. Further, the inner layer 15a contains the filler 17a with the grain diameter of $\phi 2$ smaller than the shortest interval P3 of the wiring 14d. As a result, even if a voltage is applied to the wiring substrate 10 in a state in which water has entered from the outside into the inner layer 15a for constituting the solder resist layer 15, and a so-called migration occurs in which a metal such as Cu constituting the wiring 14d is ionized and recrystallized owing to some factor, it is possible to prevent the progress of the migration.

In addition, the outer layer 15b contains the filler 17b with the grain diameter of $\phi 3$ equivalent to that in the case of the wiring substrate 100 for constituting the conventional semiconductor package 200. As a result, it is possible to attain the purposes of such as the optimization of the viscosity of the solder resist layer 15, improvement of its printability, improvement of its water resistance, and prevention of the occurrence of cracks.

Second Embodiment

Figure 21:
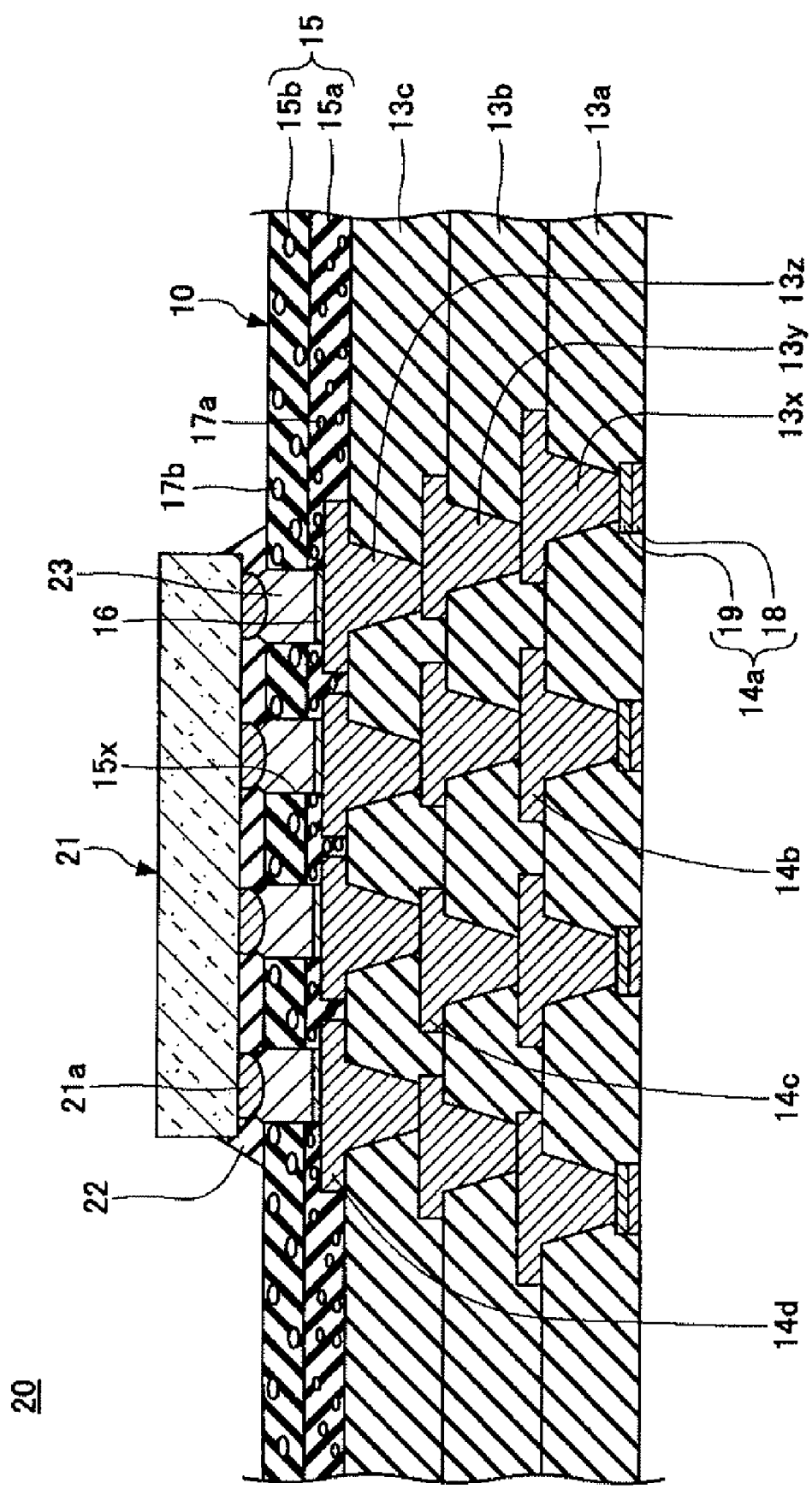
FIG. 21 is a cross-sectional view illustrating a semiconductor package in accordance with a second embodiment of the invention.

In a second embodiment, an example is shown in which the invention is applied to a semiconductor package provided with a wiring substrate having built-up wiring layers. FIG. 21 is a cross-sectional view illustrating a semiconductor package in accordance with the second embodiment of the invention. In FIG. 21, those components that are identical to those shown in FIG. 4 will be denoted by the same reference numerals, and a description will be omitted in some cases. Referring to FIG. 21, a semiconductor package 20 has the wiring substrate 10 shown in FIG. 4, a semiconductor chip 21, and an underfill resin 22. A pre-solder 23 is formed on the metal layer 16 of the wiring substrate 10 by such as the application of solder paste. The metal layer 16 and the pre-solder 23 are electrically connected.

The semiconductor chip 21 is one in which a semiconductor integrated circuit (not shown) and electrode pads (not shown) are formed on a semiconductor substrate (not shown) formed of silicon or the like into a thin plate, and ball-like terminals 21a serving as electrodes are formed on the electrode pads (not shown). Each ball-like terminal 21a of the semiconductor chip 21 is electrically connected to the pre-solder 23. The underfill resin 22 is filled between the semiconductor chip 21 and the solder resist layer 15.

It should be noted that in the case where the ball-like terminals 21a of the semiconductor chip 21 are formed of solder, each ball-like terminal 21a and the pre-solder 23 are fused into an alloy during the mounting of the semiconductor chip 21 to form one bump.

Figure 22:
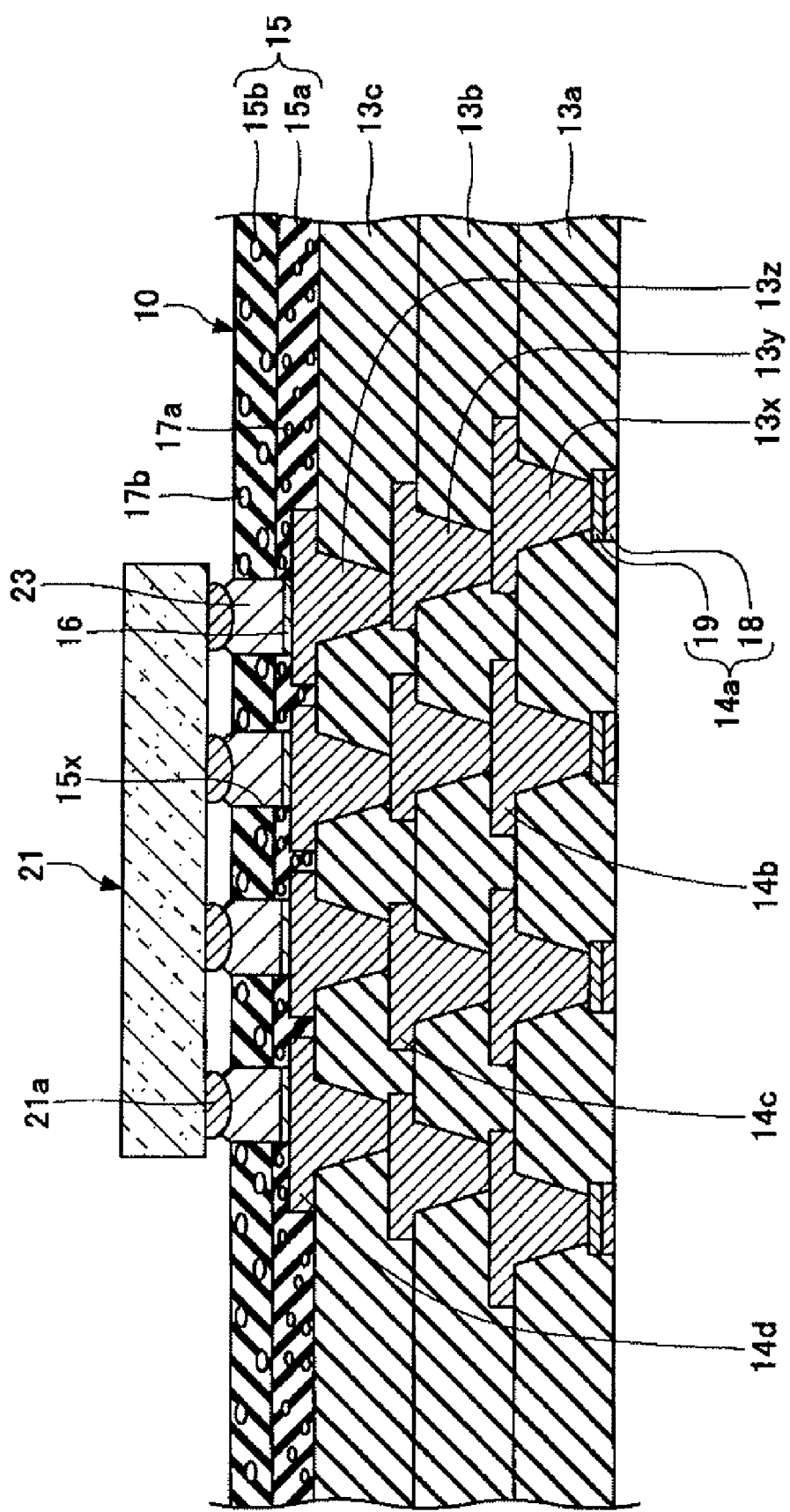
FIG. 22 is a diagram illustrating the process of manufacturing the semiconductor package in accordance with the second embodiment of the invention.

FIG. 22 is a diagram illustrating the process of manufacturing the semiconductor package in accordance with the second embodiment of the invention. In FIG. 22, those components that are identical to those shown in FIG. 21 will be denoted by the same reference numerals, and a description will be omitted in some cases.

First, the wiring substrate 10 shown in FIG. 4 is prepared, and the pre-solder 23 is formed on the metal layer 16. The pre-solder 23 can be obtained by applying solder paste to the metal layer 16 and subjecting it to reflow processing. Alternatively, solder balls may be mounted on the metal layer 16. Next, as shown in FIG. 22, each ball-like terminal 21a of the semiconductor chip 21 and the pre-solder 23 formed on the metal layer 16 are electrically connected.

The electrical connection between each ball-like terminal 21a of the semiconductor chip 21 and the pre-solder 23 formed on the metal layer 16 is effected by melting the solder by heating it to 230° C. It should be noted that in the case where the ball-like terminals 21a of the semiconductor chip 21 are formed of solder, each ball-like terminal 21a and the pre-solder 23 are fused into an alloy to form one bump. Next, the underfill resin 22 is filled between the semiconductor chip 21 and the solder resist layer 15 to thereby complete the semiconductor package 20 shown in FIG. 21.

According to the semiconductor package 20 in accordance with the second embodiment of the invention, since the semiconductor package is formed by using the wiring substrate 10 in accordance with the first embodiment of the invention, effects similar to those of the first embodiment of the invention are offered.

In addition, the outer layer 15b for constituting the solder resist layer 15 contains the filler 17b with the grain diameter of φ3 equivalent to that in the case of the wiring substrate 100 for constituting the conventional semiconductor package 200. As a result, since part of the filler 17b protrudes to the surface of the outer layer 15b for constituting the solder resist layer 15, it is possible to maintain close contact with the underfill 22.

Third Embodiment

Figure 23:
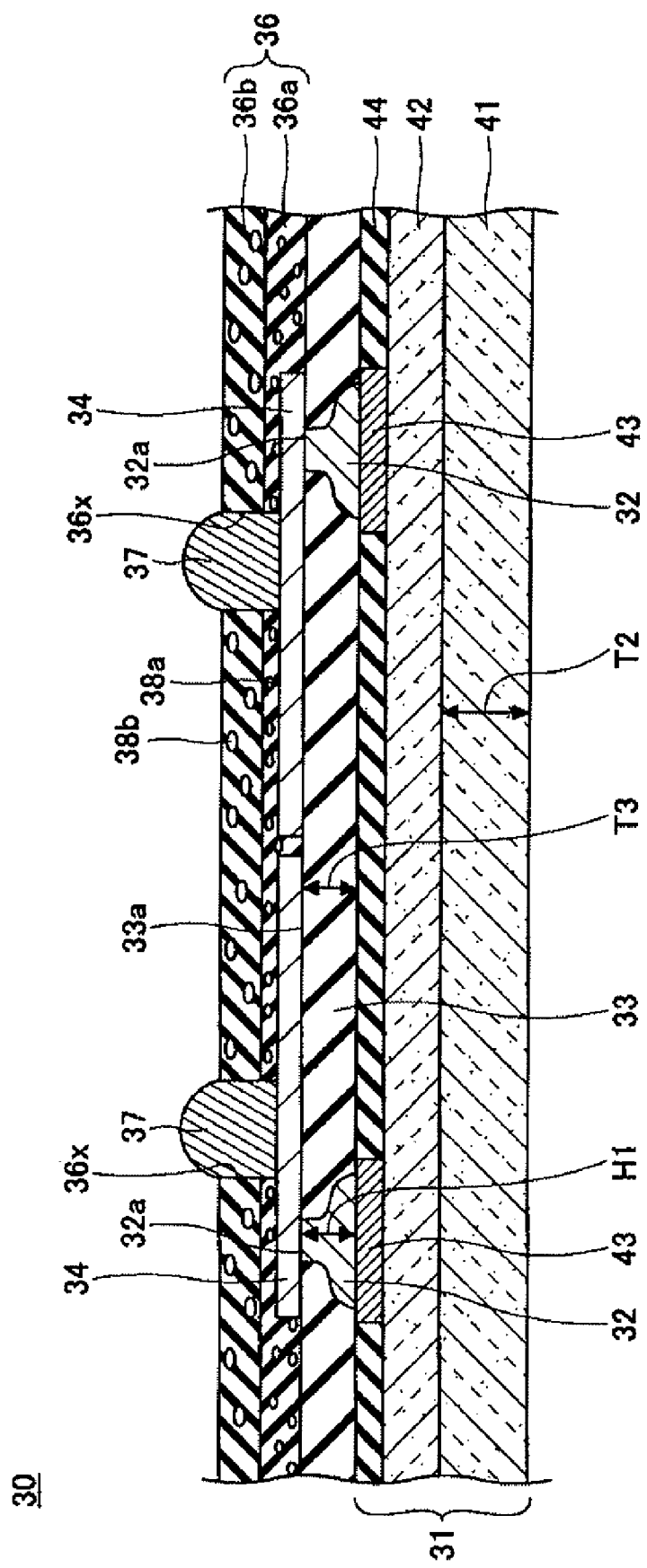
FIG. 23 is a cross-sectional view illustrating a semiconductor package in accordance with a third embodiment of the invention.

In a third embodiment, an example is shown in which the invention is applied to a semiconductor package (so-called chip size package: CSP) of a chip size which is substantially identical to that of a semiconductor chip in a plan view. FIG. 23 is a cross-sectional view illustrating a semiconductor package in accordance with the third embodiment of the invention. Referring to FIG. 23, a semiconductor package 30 has a semiconductor chip 31, internal connection terminals 32, an insulating layer 33, a wiring 34, a solder resist layer 36, and external connection terminals 37.

Figure 24:
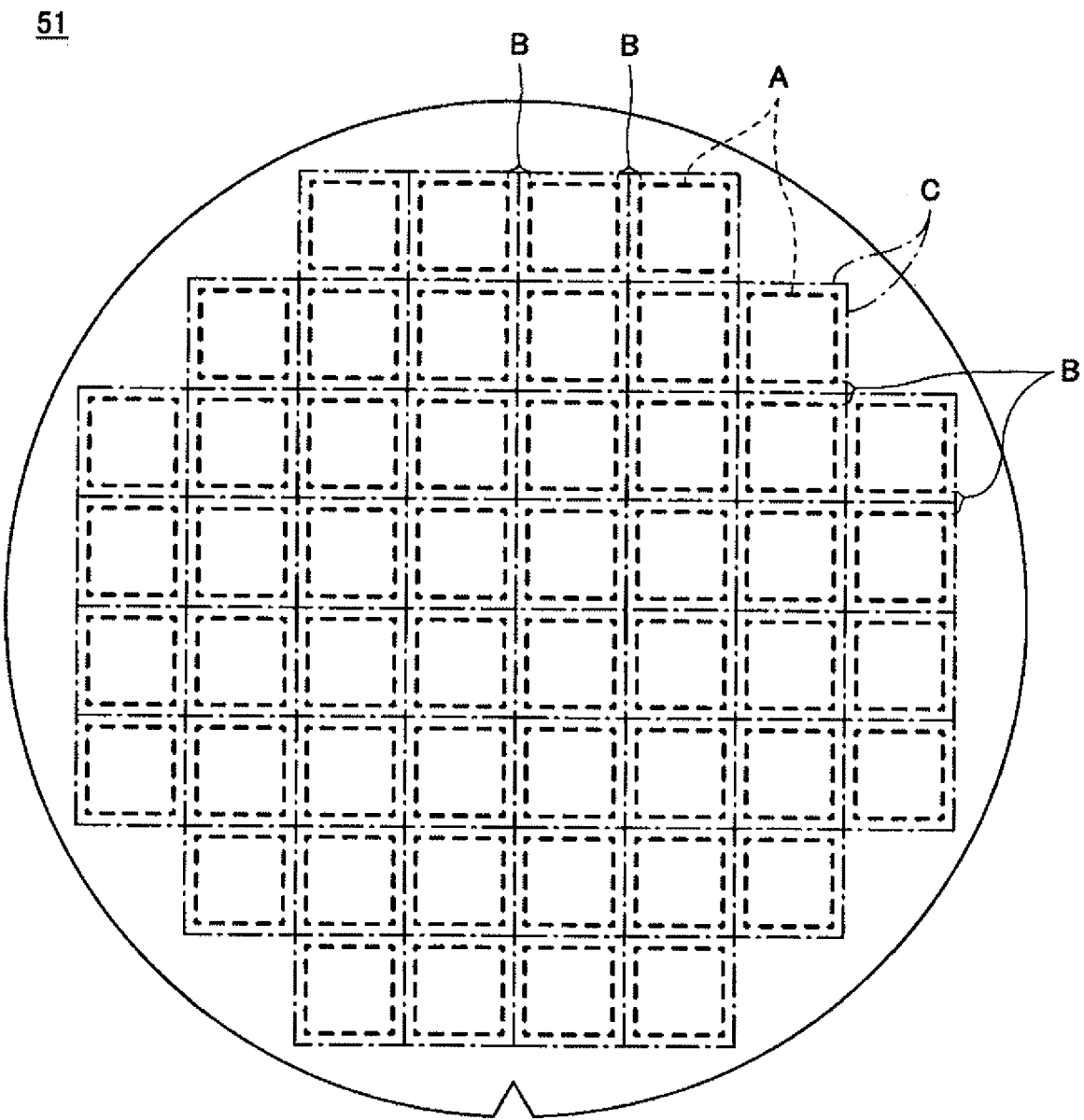
FIG. 24 is a plan view of a semiconductor substrate for forming the semiconductor package in accordance with the third embodiment of the invention.

FIG. 24 is a plan view of a semiconductor substrate for forming the semiconductor package in accordance with the third embodiment of the invention. In FIG. 24, reference numeral 51 denotes a semiconductor wafer, and reference character C denotes a position (hereafter referred to as the "wafer cutting position C") at which a dicer cuts the semiconductor wafer 51. The semiconductor wafer 51 is provided with a plurality of semiconductor-package forming regions A and a plurality of scribing regions B each including the wafer cutting position C and for separating the plurality of semiconductor-package forming regions A. The plurality of semiconductor-package forming regions A are regions for forming the semiconductor packages 30. The semiconductor wafer 51 is formed into a thin plate and is cut at the wafer cutting positions C, thereby to each serve as a semiconductor substrate 41 shown in FIG. 23.

In FIG. 23, the semiconductor chip 31 has the semiconductor substrate 41, a semiconductor integrated circuit 42, a plurality of electrode pads 43, and a protective film 44. The semiconductor substrate 41 is a substrate for forming the semiconductor integrated circuit 42 thereon. The semiconductor substrate 41 is has been formed into a thin plate. The thickness T2 of the semiconductor substrate 41 can be set to 100 μm to 300 mm. The semiconductor substrate 41 is fabricated as the semiconductor wafer 51, which is, for example, an Si wafer formed into a thin plate, is discretized by dicing.

The semiconductor integrated circuit 42 is provided on the obverse surface side of the semiconductor substrate 41. The semiconductor integrated circuit 42 is constituted by an insulating layer (not shown) stacked on the semiconductor substrate 41, and vias (not shown) and wirings (not shown) provided in the stacked insulating layer.

The plurality of electrode pads 43 are provided on the semiconductor integrated circuit 42. The electrode pads 43 are respectively connected electrically to the wirings (not shown) provided on the semiconductor integrated circuit 42. As the material of the electrode pads 43, it is possible to use, for example, Al or the like.

The protective film 44 is provided on the semiconductor integrated circuit 42. The protective film 44 is a film for protecting the semiconductor integrated circuit 42, and is in some cases called a passivation film. As the protective film, it is possible to use, for example, a SiN film, a PSG film, or the like. In addition, a layer constituted by polyimide or the like may be further stacked on the layer constituted by such as the SiN film or the PSG film.

The internal connection terminals 32 are respectively provided on the electrode pads 43. The internal connection terminals 32 are for electrically connecting together the semiconductor integrated circuit 42 and the wiring 34. The height H1 of the internal connection terminals 32 can be set to, for example, 10 μm to 60 μm. As the internal connection terminals 32, it is possible to use, for example, Au bumps, an Au plating film, and a metal film constituted by an Ni film formed by a electroless plating process and an Au film covering the same. The Au bumps can be formed by a bonding wire by using a wire bonding apparatus. Alternatively, the Au bumps can also be formed by a plating process.

The insulating layer 33 protects a circuit forming surface (principal surface) of the semiconductor chip 31 and serves as a base material at the time when the wiring 34 is formed. The insulating layer 33 is provided so as to cover the semiconductor chip 31 and the internal connection terminals 32 excluding upper surfaces 32a of the internal connection terminals 32. The upper surfaces 32a of the internal connection terminals 32 are exposed from the insulating layer 33. An upper surface 33a of the insulating layer 33 is made substantially flush with the upper surfaces 32a of the internal connection terminals 32.

As the insulating layer 33, it is possible to use, for example, an adhesive sheet-like insulating resin (e.g., a non-conductive film (NCF)), a paste-like insulating resin (e.g., a non-conductive paste (NCP)), or the like. The thickness T3 of the insulating layer 33 can be set to, for example, 10 μm to 60 μm.

The wiring 34 is in some cases called rewiring and is provided to make different the position of the electrode pads 43 and the position of the external connection terminals 37 (because of the fan-in and for disposing the terminals at an arbitrary position). As the material of the wiring 34, it is possible to use, for example, Cu or the like.

The wiring 34 is provided on the upper surface 33a of the insulating layer 33 so as to be brought into contact with the upper surface 32a of the internal connection terminal 32. The wiring 34 is electrically connected to the semiconductor integrated circuit 42 through the internal connection terminals 32. The thickness of the wiring 34 can be set to, for example, 12 μm.

The solder resist layer 36 having openings 36x is formed so as to cover the wiring 34. The solder resist layer 36 is constituted by an inner layer 36a containing a filler 38a and an outer layer 36b containing a filler 38b. An Ni/Au plating layer in which an Ni plating layer and an Au plating layer are stacked in that order, for example, may be formed on the wiring 34 in each opening 36x of the solder resist layer 36.

The external connection terminals 37 are each provided on the wiring 34 exposed in the opening 36x. The external connection terminals 37 are terminals which are electrically connected to pads provided on a mounting substrate (not shown) such as a motherboard. As the external connection terminals 37, it is possible to use, for example, solder bumps or the like. As the material of the external connection terminals 37, it is possible to use, for example, an alloy containing Pb, an alloy of Sn and Cu, an alloy of Sn and Ag, or the like.

Figure 25:
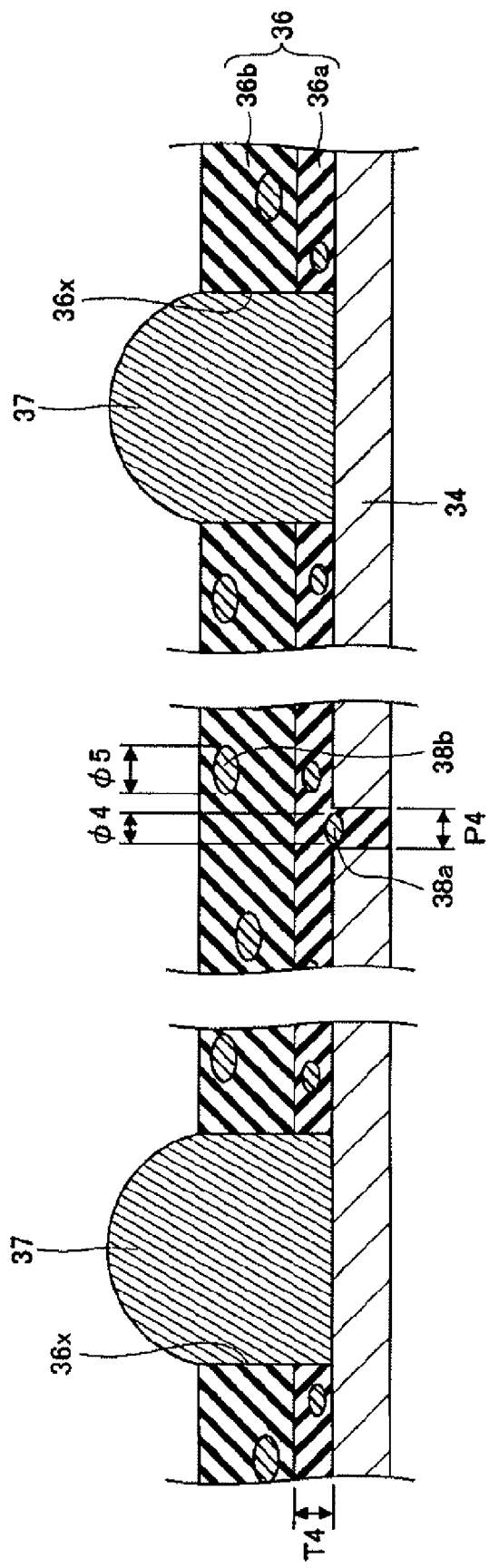
FIG. 25 is a cross-sectional view partially illustrating the semiconductor package shown in FIG. 23.

FIG. 25 is a cross-sectional view partially illustrating the semiconductor package shown in FIG. 23. In FIG. 25, those components that are identical to those shown in FIG. 23 will be denoted by the same reference numerals, and a description will be omitted in some cases. Symbol $\phi 4$ denotes the grain diameter of the filler 38a. Symbol $\phi 5$ denotes the grain diameter of the filler 38b. Reference character P4 denotes a shortest interval of the wiring 34. Reference character T4 denotes a thickness from an upper surface of the inner layer 36a to an upper surface of the wiring 34.

The inner layer 36a for constituting the solder resist layer 36 contains the filler 38a with the grain diameter of $\phi 4$. There are cases where the filler 38a agglutinates to form a so-called secondary aggregation substance which has such as a spherical shape as a whole, in which case the grain diameter substantially becomes large. In this invention, however, since such a secondary aggregation substance is removed in advance, the inner layer 36a for constituting the solder resist layer 36 does not contain the secondary aggregation substance of the filler 38a. The thickness T4 should preferably be set larger than the grain diameter $\phi 4$ of the filler 38a.

The outer layer 36b for constituting the solder resist layer 36 contains the filler 38b with the grain diameter of $\phi 5$. The fillers 38a and 38b are respectively contained in the inner layer 36a and the outer layer 36b constituting the solder resist layer 36 for purposes of such as the optimization of the viscosity of the solder resist layer 36, improvement of its printability, improvement of its water resistance, and prevention of the occurrence of cracks.

The grain diameter $\phi 4$ of the filler 38a is smaller than the shortest interval P4 of the wiring 34. The grain diameter $\phi 5$ of the filler 38b may be arbitrary irrespective of the shortest interval P4 of the wiring 34. However, in view of the purposes of such as the optimization of the viscosity of the solder resist layer 36, improvement of its printability, improvement of its water resistance, and prevention of the occurrence of cracks, the grain diameter $\phi 5$ of the filler 38b should preferably be equivalent to the grain diameter $\phi 1$ (see FIG. 2) of the filler 170 in the wiring substrate 100 for constituting the conventional semiconductor package 200.

For example, if it is assumed that the shortest interval P4 of the wiring 34 is 8 μm, the grain diameter $\phi 4$ of the filler 38a needs to be made smaller than the shortest interval P4=8 μm, and can be set to be not more than 6 μm. The grain diameter $\phi 5$ of the filler 38b may be equivalent to the grain diameter $\phi 1$ of the filler 170 in the wiring substrate 100 for constituting the conventional semiconductor package 200, and can be set to, for example, 20 μm.

It should be noted that the inner layer 36a for constituting the solder resist layer 36 may not contain the filler 38a. In that case, the purposes of such as the optimization of the viscosity of the solder resist layer 36, improvement of its printability, improvement of its water resistance, and prevention of the occurrence of cracks can be attained by the outer layer 36b containing the filler 38b.

As the inner layer 36a and the outer layer 36b for constituting the solder resist layer 36, it is possible to use, for example, a photosensitive resin composition including such as an epoxy-based resin and an imide-based resin. Further, a volatile solvent may be contained therein. As the fillers 38a and 38b, it is possible to use inorganic compounds such as silicon oxide, titanium oxide, aluminum oxide, aluminum nitride, silicon carbide, calcium titanate, and zeolite, or organic compounds, for example.

The filler 38a and the filler 38b may be formed of an identical material or may be formed of different materials. The amount of the filler 38a contained in the inner layer 36a and the amount of the filler 38b contained in the outer layer 36b may be substantially identical or may be different. The amount referred to herein is, for example, the weight (wt. %) of the filler 38a or the filler 38b with respect to the weight of the photosensitive resin composition constituting the inner layer 36a or the outer layer 36b.

Thus, the solder resist layer 36 is constituted by the inner layer 36a and the outer layer 36b. Further, the inner layer 36a contains the filler 38a with the grain diameter of $\phi 4$ smaller than the shortest interval P4 of the wiring 34, while the outer layer 36b contains the filler 38b with the grain diameter of $\phi 5$ equivalent to that in the case of the wiring substrate 100 for constituting the conventional semiconductor package 200.

As a result, even if a voltage is applied to the semiconductor package 30 in a state in which water has entered from the outside into the inner layer 36a for constituting the solder resist layer 36, and a so-called migration occurs in which a metal such as Cu constituting the wiring 34 is ionized and recrystallized owing to some factor, it is possible to prevent the progress of the migration. At the same time, it is also possible to attain the purposes of such as the optimization of the viscosity of the solder resist layer 36, improvement of its printability, improvement of its water resistance, and prevention of the occurrence of cracks.

More specifically, even if water enters the inner layer 36a from an interface between the filler 38a and the inner layer 36a, the ionization of the metal such as Cu constituting the wiring 34 is not accelerated since the filler 38a is not brought into contact with the adjacent wiring 34, as shown in FIG. 25.

Accordingly, the ionized metal does not recrystallize when it moves into the inner layer 36a along the interface between the filler 38a and the inner layer 36a. Hence, the dielectric resistance between the adjacent lines of the wiring 34 can be maintained at a normal value, the adjacent lines of the wiring 34 are not electrically shortcircuited, and it is possible to prevent the progress of the migration.

FIGS. 26 to 38 are diagrams illustrating the process of manufacturing the semiconductor package in accordance with the third embodiment of the invention. In FIGS. 26 to 38, those components that are identical to those shown in FIG. 23 will be denoted by the same reference numerals, and a description will be omitted in some cases. In FIGS. 26 to 38, reference character C denotes a position at which a dicer cuts the semiconductor wafer 51 (this position will be hereafter referred to as the "wafer cutting position C"); reference character A denotes a semiconductor-package forming region for forming the semiconductor package 30 thereon (this region will be hereafter referred to as the "semiconductor-package forming region A"); and reference character B denotes a scribing region including the wafer cutting position C and for separating the plurality of semiconductor-package forming regions A (this region will be hereafter referred to as the "scribing region B").

Figure 26:
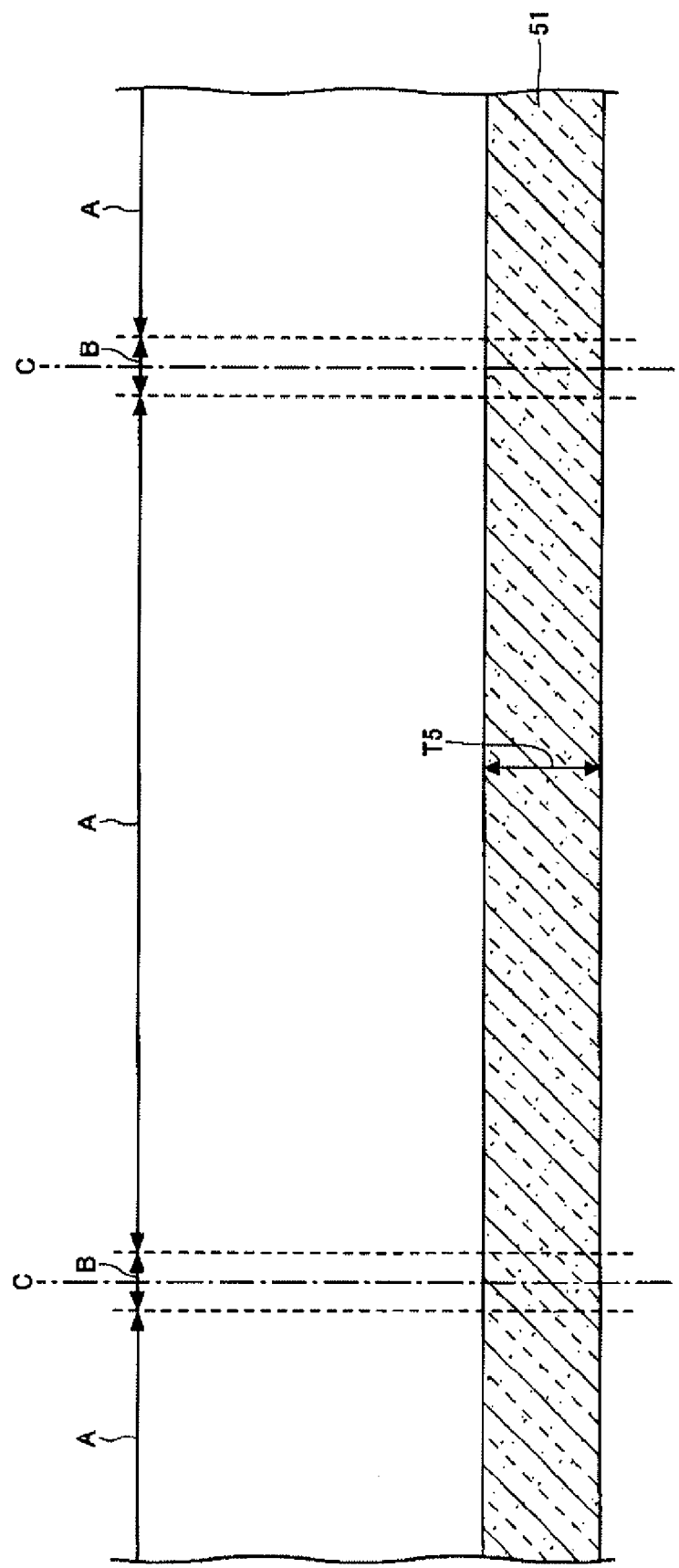
FIG. 26 is a diagram (step 1) illustrating the process of manufacturing the semiconductor package in accordance with the third embodiment of the invention.

First, in the step shown in FIG. 26, the semiconductor wafer 51 is prepared which is provided with the plurality of semiconductor-package forming regions A and the plurality of scribing regions B each including the wafer cutting position C and for separating the plurality of semiconductor-package forming regions A (see FIG. 24). The semiconductor wafer 51 is formed into a thin plate and is cut at the wafer cutting positions C, thereby to each serve as the semiconductor substrate 41 described before (see FIG. 23). As the semiconductor wafer 51, it is possible to use an Si wafer or the like. The thickness T5 of the semiconductor wafer 51 can be set to, for example, 500 μm to 775 μm.

Figure 27:
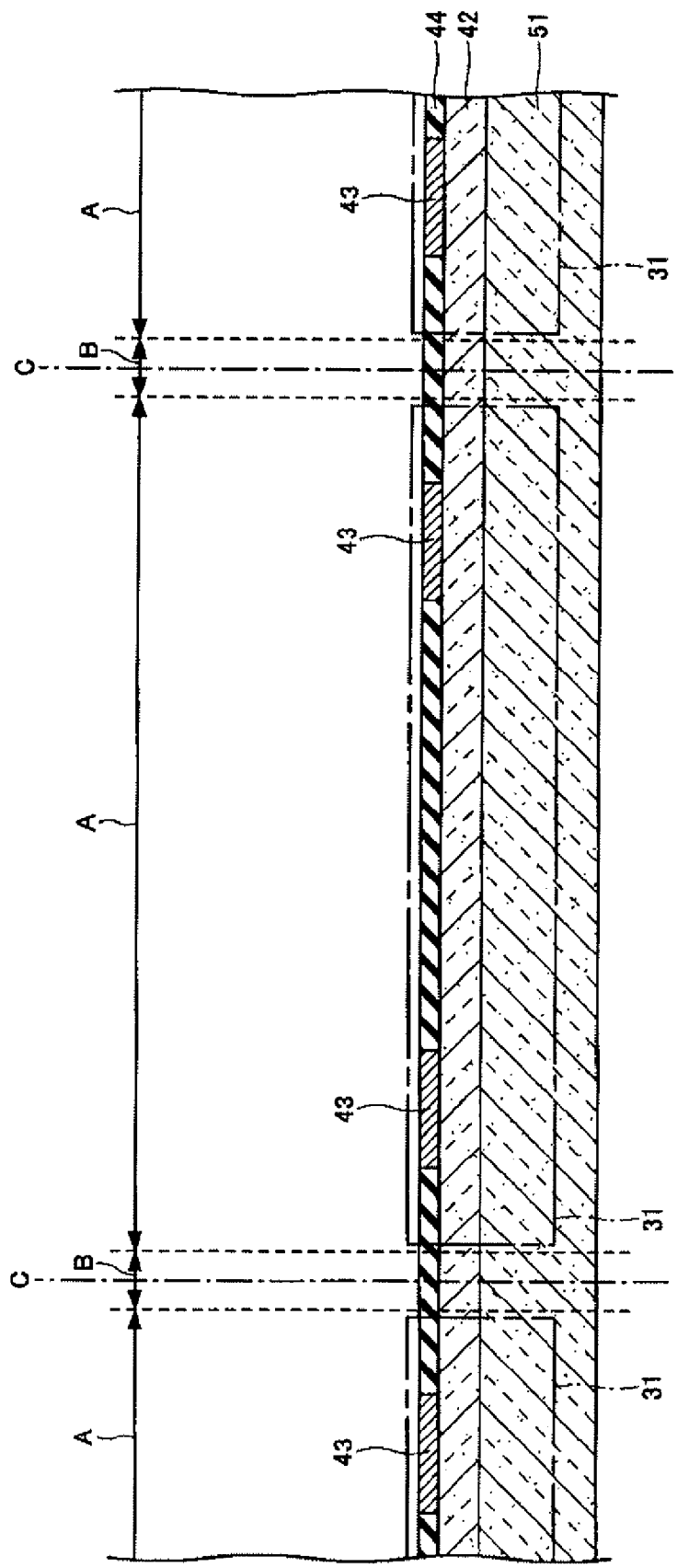
FIG. 27 is a diagram (step 2) illustrating the process of manufacturing the semiconductor package in accordance with the third embodiment of the invention.

Next, in the step shown in FIG. 27, the semiconductor chips 31 each having the semiconductor integrated circuit 42, the electrode pads 43, and the protective film 44 are formed on the obverse surface side of the semiconductor wafer 51 at positions corresponding to the semiconductor-package forming regions A by a known technique. As the material of the electrode pads 43, it is possible to use, for example, Al or the like. As the protective film, it is possible to use, for example, a SiN film, a PSG film, or the like. In addition, a layer constituted by polyimide or the like may be further stacked on the layer constituted by such as the SiN film or the PSG film.

Figure 28:
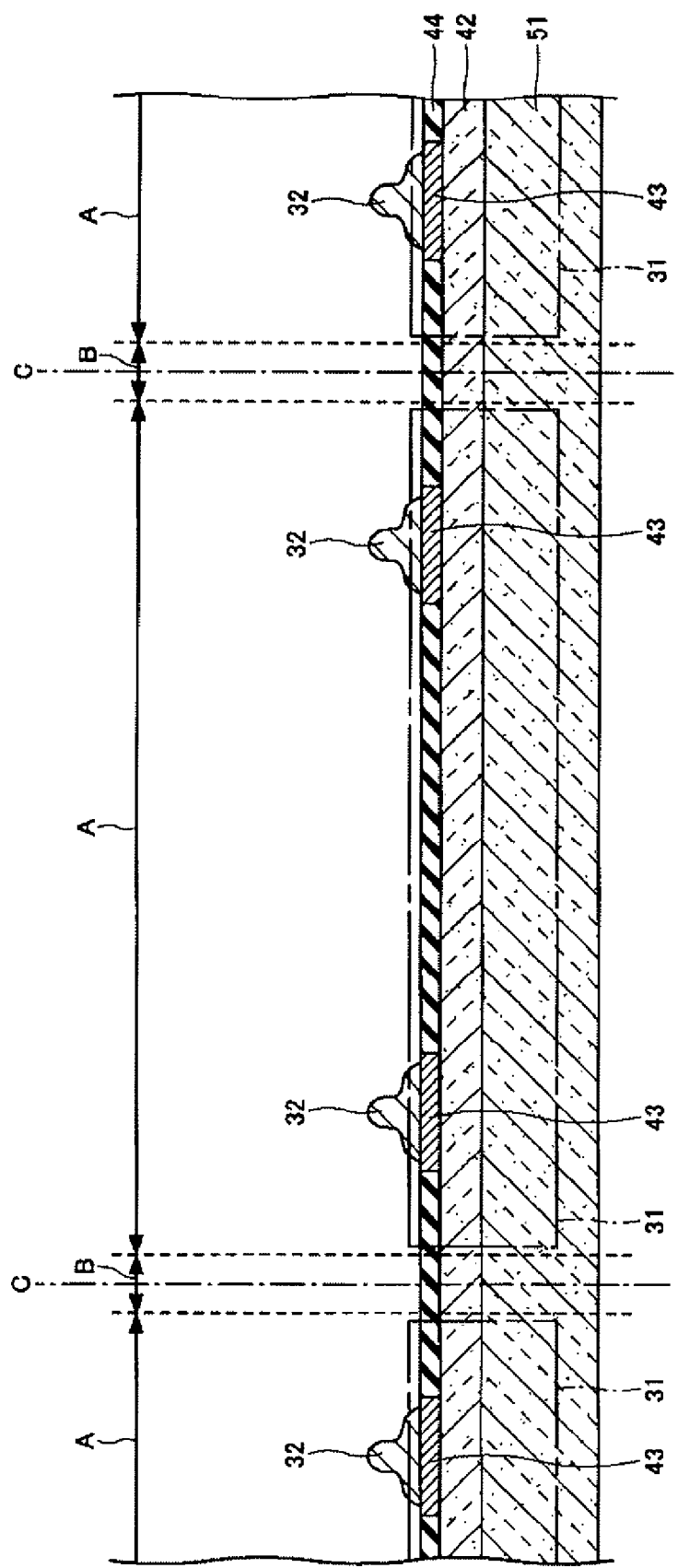
FIG. 28 is a diagram (step 3) illustrating the process of manufacturing the semiconductor package in accordance with the third embodiment of the invention.

Next, in the step shown in FIG. 28, the internal connection terminals 32 are respectively provided on the plurality of electrode pads 43 in the plurality of semiconductor-package forming regions A. As the internal connection terminals 32, it is possible to use, for example, Au bumps, an Au plating film, and a metal film constituted by an Ni film formed by a electroless plating process and an Au film which is stacked on the Ni film. The Au bumps can be formed by a bonding wire by using a wire bonding apparatus. Alternatively, the Au bumps can also be formed by a plating process. It should be noted that there are variations in the height of the plurality of internal connection terminals 32 formed in the step shown in FIG. 28.

Figure 29:
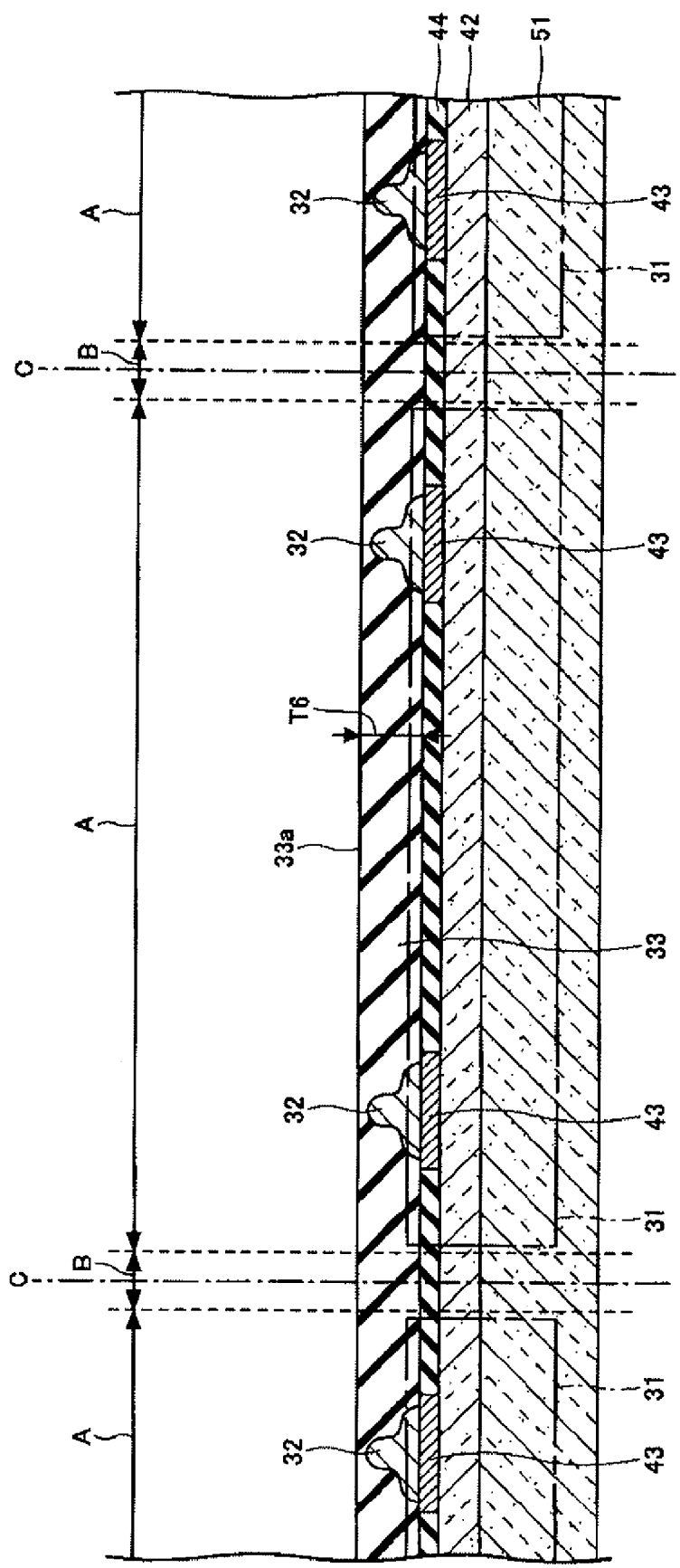
FIG. 29 is a diagram (step 4) illustrating the process of manufacturing the semiconductor package in accordance with the third embodiment of the invention.

Next, in the step shown in FIG. 29, the insulating layer 33 is formed on the side where the internal connection terminals 32 are provided, so as to cover the plurality of semiconductor chips 31 and the internal connection terminals 32. As the insulating layer 33, it is possible to use, for example, an adhesive sheet-like insulating resin (e.g., a non-conductive film (NCF)), a paste-like insulating resin (e.g., a non-conductive paste (NCP)), or the like. The thickness T6 of the insulating layer 33 can be set to, for example, 20 μm to 100 μm.

In the case where the adhesive sheet-like insulating resin is used as the insulating layer 33, the insulating layer 33 is formed by adhering the sheet-like insulating resin onto the upper surface side of the structure shown in FIG. 28. Also, in the case where the paste-like insulating resin is used as the insulating layer 33, a paste-like insulating resin is formed on the upper surface side of the structure shown in FIG. 28 by a printing process and subsequently by performing prebaking to allow the insulating resin to be semi-cured. This semi-cured insulating resin possesses an adhesive property.

Figure 30:
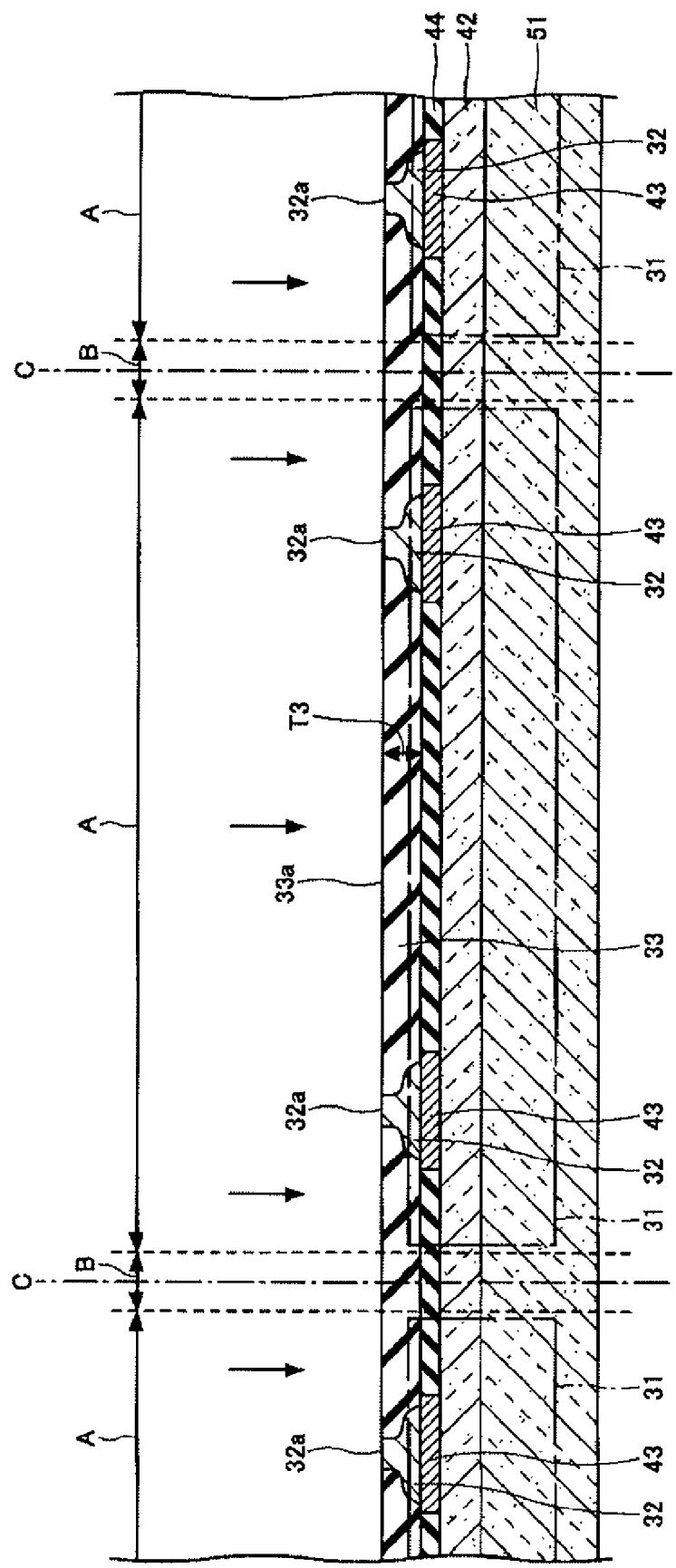
FIG. 30 is a diagram (step 5) illustrating the process of manufacturing the semiconductor package in accordance with the third embodiment of the invention.

Next, in the step shown in FIG. 30, in a state in which the structure shown in FIG. 29 is heated, the insulating layer 33 is pressed from the upper surface 33a side of the insulating layer 33 (see the arrows in FIG. 30). Consequently, the upper surface (specifically, the upper surface 33a of the insulating layer 33 and the upper surfaces 32a of the internal connection terminals 32) of the structure shown in FIG. 30 assumes a flat surface.

In addition, as the structure shown in FIG. 30 is heated, the insulating layer 33 is cured. The thickness T3 of the insulating layer 33 after pressing can be set to, for example, 10 μm to 60 μm. In a case where part of the material constituting the insulating layer 33 is adhered to the upper surfaces 32a of the internal connection terminals 32, etching or the like is performed to allow the upper surfaces 32a of the internal connection terminals 32 to be completely exposed from the insulating layer 33. The upper surface 33a of the insulating layer 33 may be surface roughened, as required.

Figure 31:
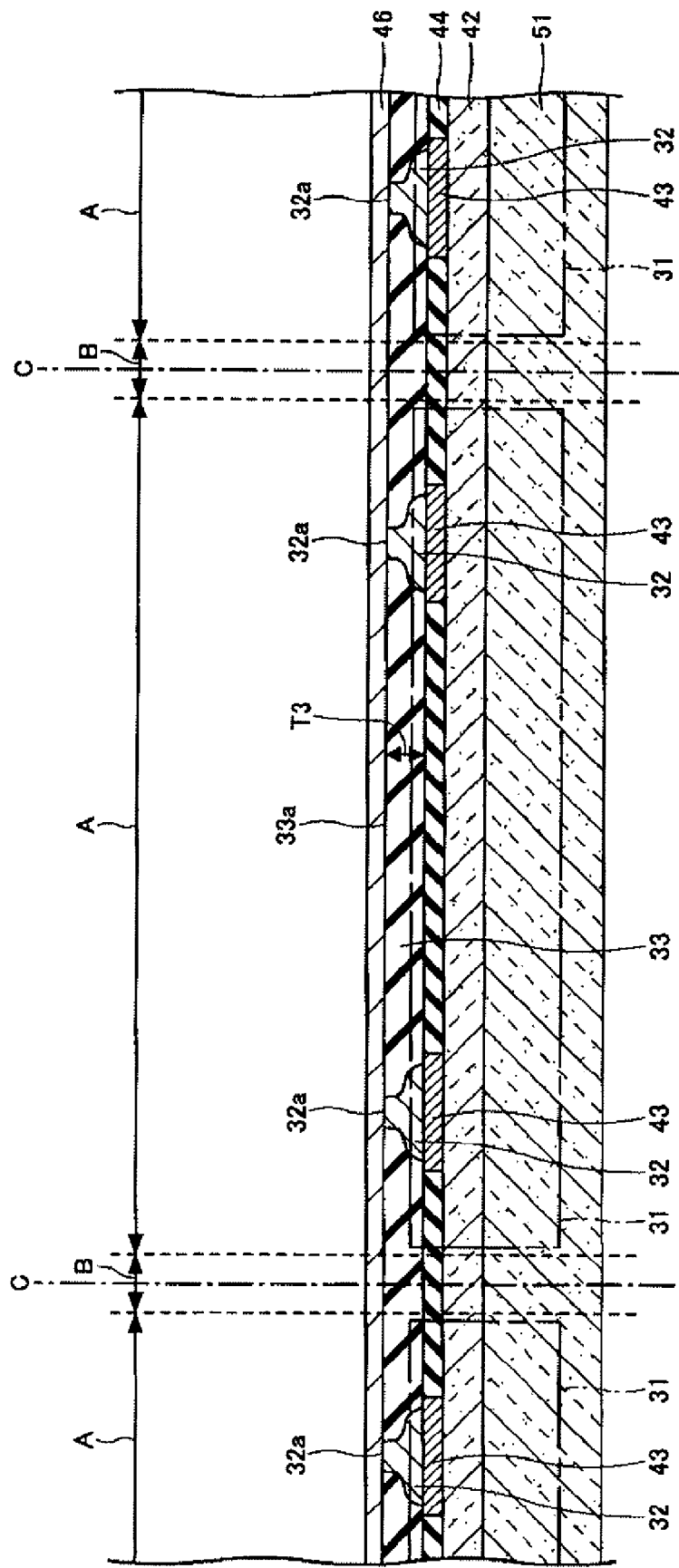
FIG. 31 is a diagram (step 6) illustrating the process of manufacturing the semiconductor package in accordance with the third embodiment of the invention.
Figure 32:
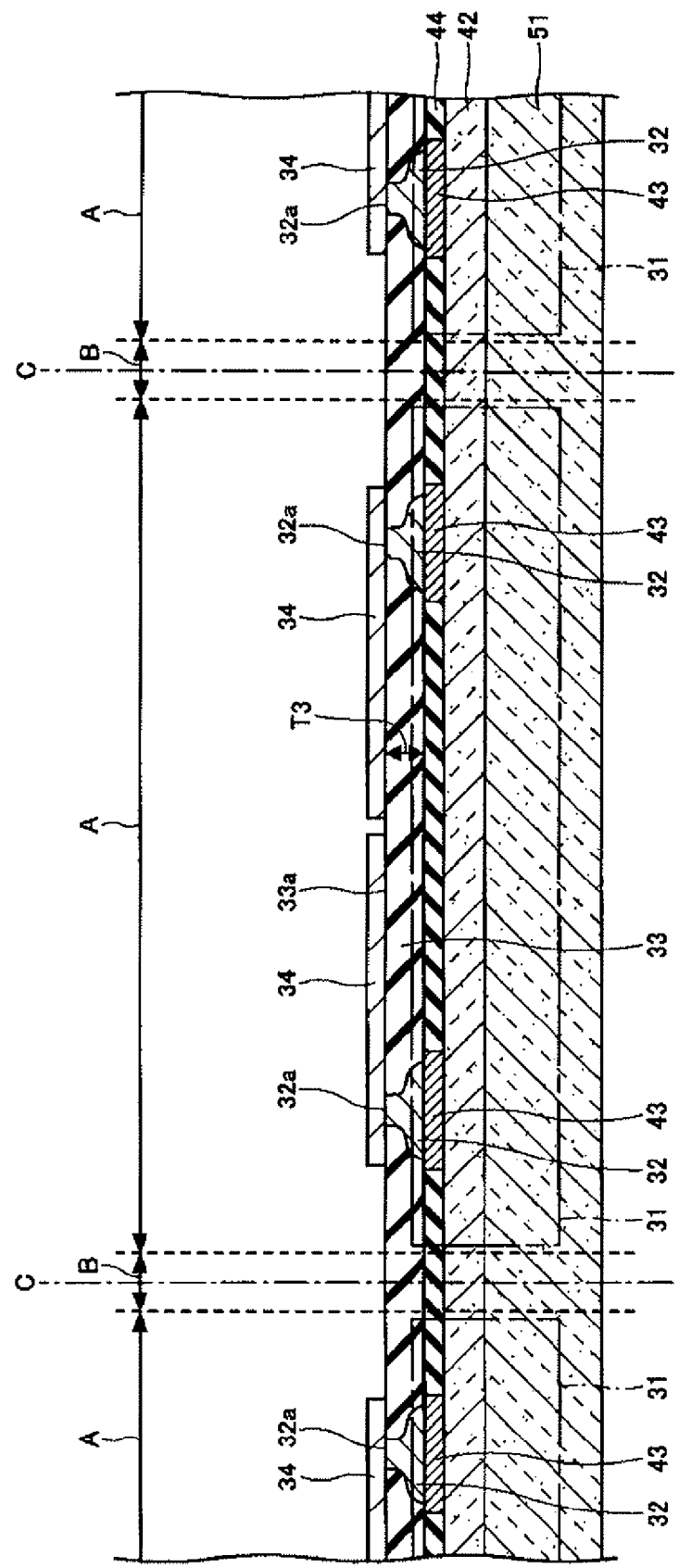
FIG. 32 is a diagram (step 7) illustrating the process of manufacturing the semiconductor package in accordance with the third embodiment of the invention.

Next, in the step shown in FIG. 31, a metal layer 46 is formed on the upper surface 33a of the insulating layer 33. The metal layer 46 is subjected to etching in the step shown in FIG. 32, which will be referred to layer, so as to be formed into the wiring pattern 34. Next, in the step shown in FIG. 32, the metal layer 46 is subjected to patterning by etching to form the wiring 34, and the roughening of the wiring pattern 34 is carried out.

Specifically, a patterned resist film is formed on the metal layer 46, and the wiring pattern 34 is formed by subjecting the metal layer 46 to etching by using this resist film as a mask. The surface roughening of the wiring pattern can be effected by the method of either blackening or roughening etching. The aforementioned roughening is for improving adhesion between the wiring pattern 34 and the solder resist layer 36 which is formed on the upper surface and side surfaces of the wiring pattern 34.

Figure 33:
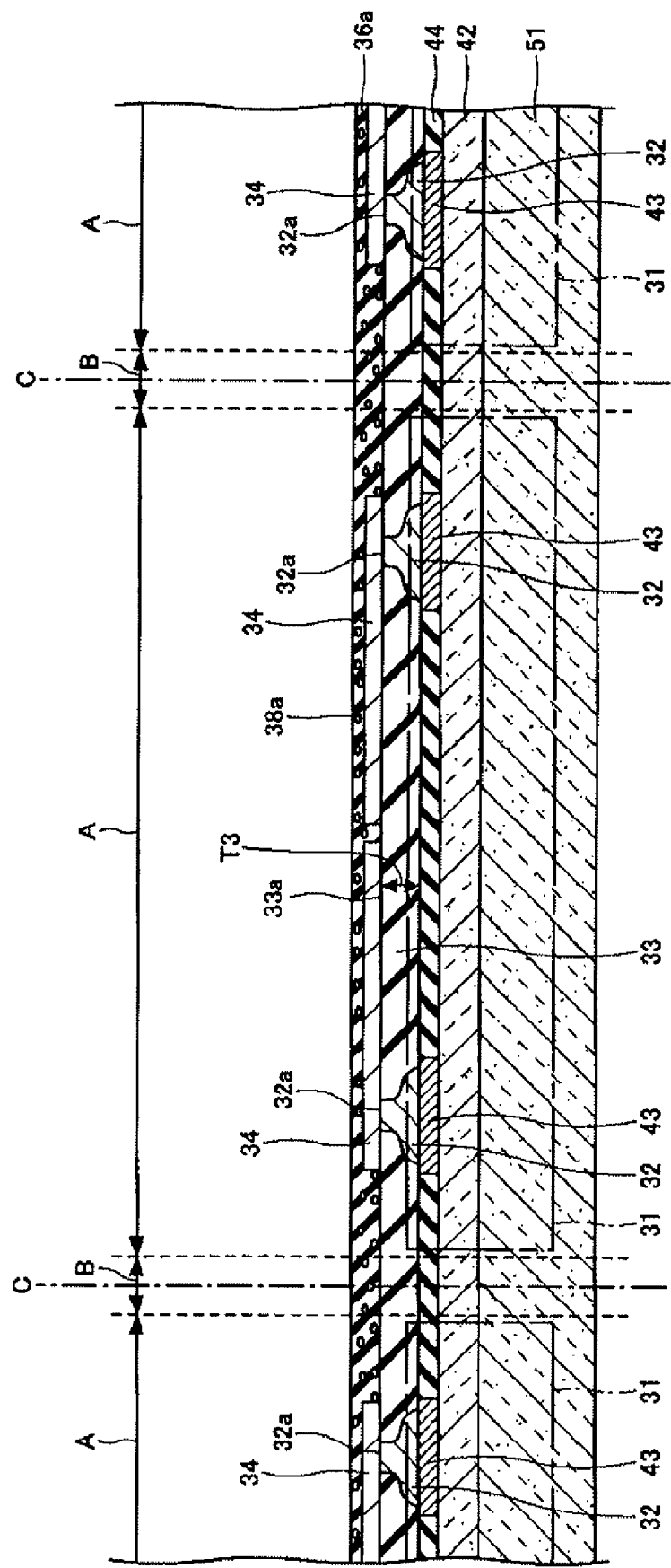
FIG. 33 is a diagram (step 8) illustrating the process of manufacturing the semiconductor package in accordance with the third embodiment of the invention.

Next, in the step shown in FIG. 33, a solder resist containing the filler 38a whose grain diameter is φ4 is applied onto the insulating layer 33 so as to cover the wiring 34, thereby forming the inner layer 36a for constituting the solder resist layer 36. As the inner layer 36a, it is possible to use, for example, a photosensitive resin composition including such as an epoxy-based resin and an imide-based resin. Further, a volatile solvent may be contained therein. As the filler 38a, it is possible to use an inorganic compound such as silicon oxide, titanium oxide, aluminum oxide, aluminum nitride, silicon carbide, calcium titanate, and zeolite, or an organic compound, for example.

Figure 34:
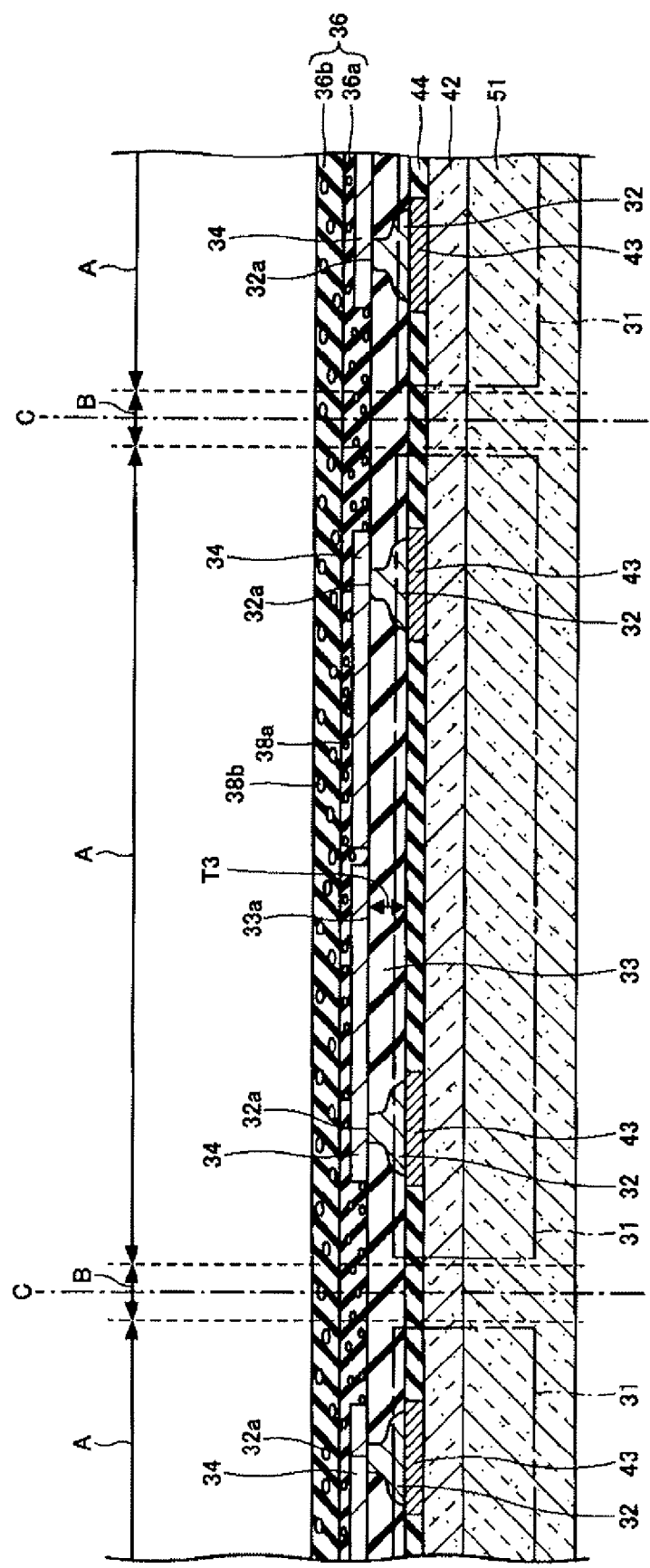
FIG. 34 is a diagram (step 9) illustrating the process of manufacturing the semiconductor package in accordance with the third embodiment of the invention.

Next, in the step shown in FIG. 34, a solder resist containing the filler 38b whose grain diameter is φ5 is applied onto the inner layer 36a, thereby forming the outer layer 36b for constituting the solder resist layer 36. As the outer layer 36b, it is possible to use, for example, a photosensitive resin composition including such as an epoxy-based resin and an imide-based resin. Further, a volatile solvent may be contained in the outer layer 36b.

As the filler 38b, it is possible to use an inorganic compound such as silicon oxide, titanium oxide, aluminum oxide, aluminum nitride, silicon carbide, calcium titanate, and zeolite, or an organic compound, for example. The solder resist layer 36 which is constituted by the inner layer 36a and the outer layer 36b is thereby formed.

Figure 35:
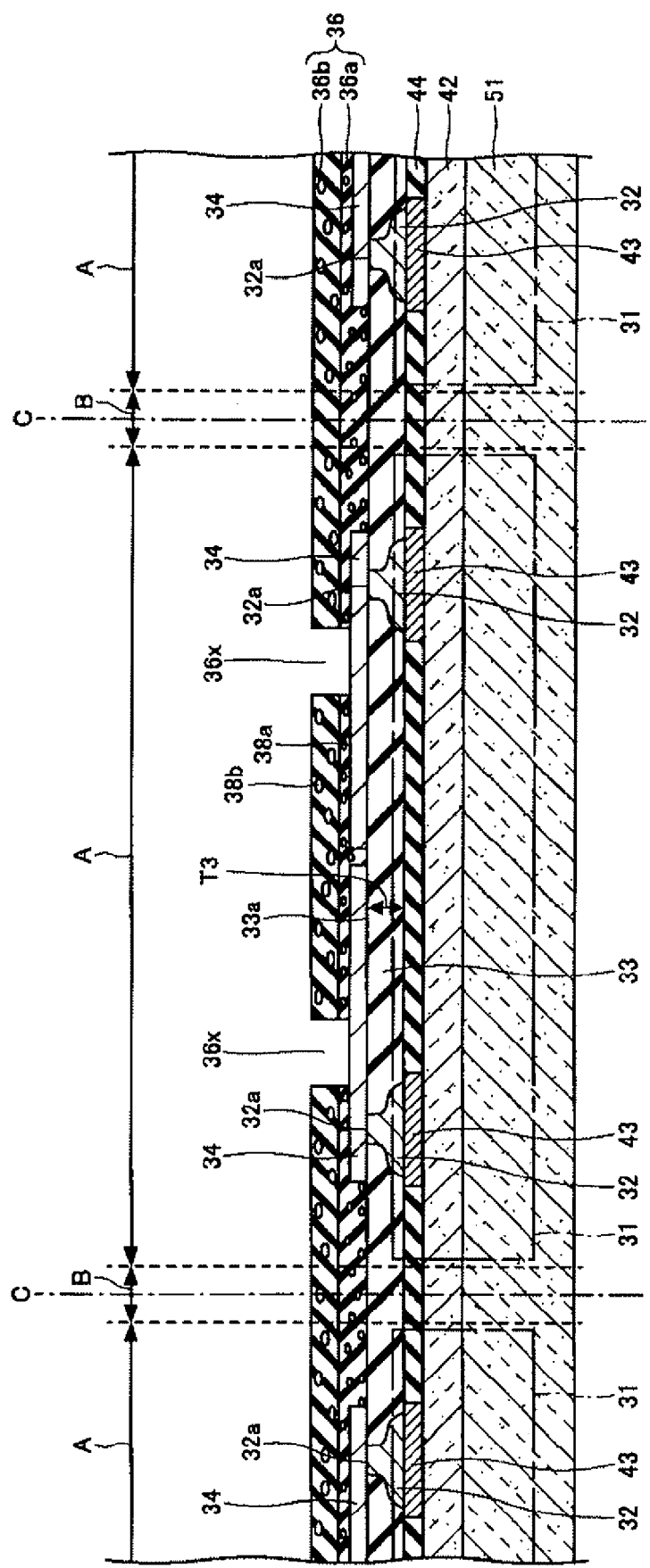
FIG. 35 is a diagram (step 10) illustrating the process of manufacturing the semiconductor package in accordance with the third embodiment of the invention.

Next, in the step shown in FIG. 35, the solder resist layer 36 is subjected to exposure and development to thereby form the openings 36x. Consequently, the wiring 34 is exposed in the openings 36x of the solder resist layer 36. Further, an Ni/Au plating layer in which an Ni plating layer and an Au plating layer are stacked in that order, for example, may be formed on the wiring 34 in each opening 36x of the solder resist layer 36.

Figure 36:
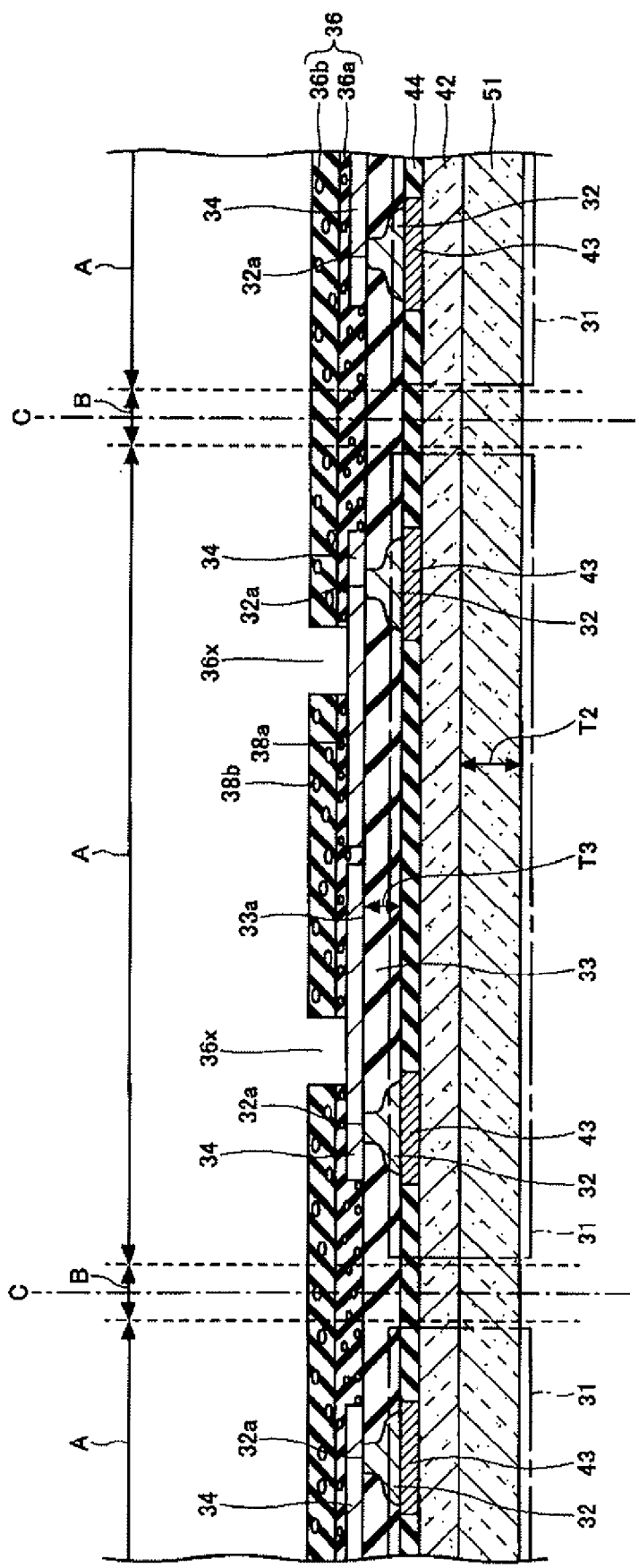
FIG. 36 is a diagram (step 11) illustrating the process of manufacturing the semiconductor package in accordance with the third embodiment of the invention.

Next, in the step shown in FIG. 36, the semiconductor wafer 51 is polished or ground from the reverse surface side of the semiconductor wafer 51 to form the solder resist layer 51 into a thin plate. A backside grinder or the like, for instance, can be used for the thinning of the solder resist layer 51. The thickness T2 of the semiconductor wafer 51 after the thinning can be set to, for example, 100 μm to 300 μm. It should be noted that the step shown in FIG. 36 may be omitted in some cases.

Figure 37:
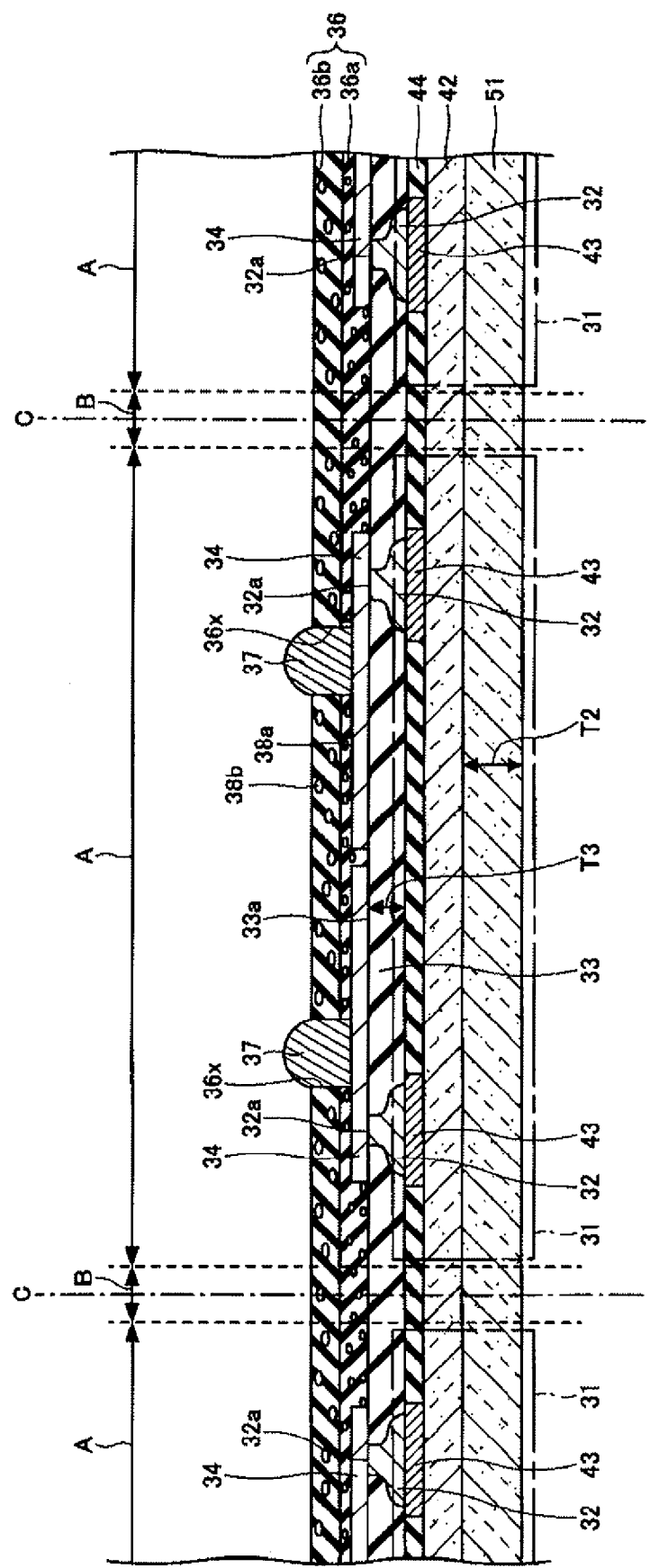
FIG. 37 is a diagram (step 12) illustrating the process of manufacturing the semiconductor package in accordance with the third embodiment of the invention.
Figure 38:
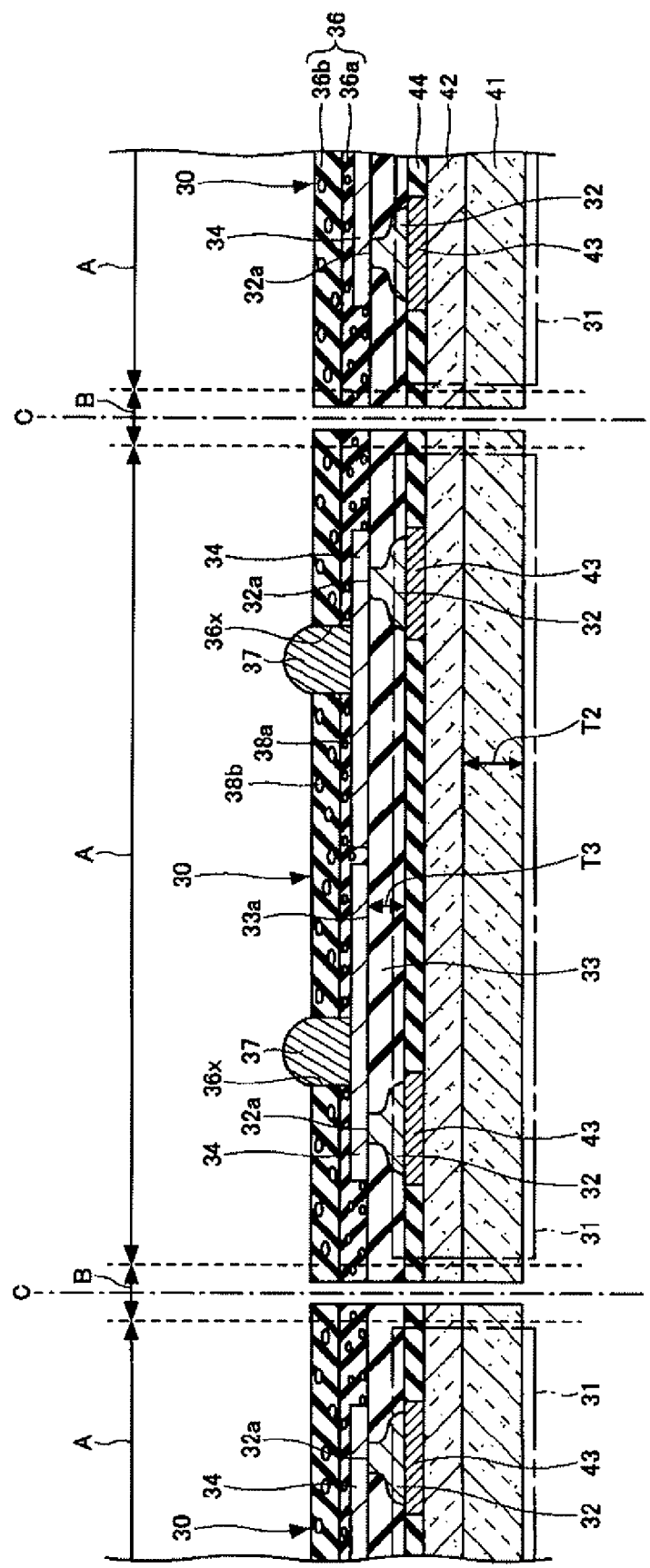
FIG. 38 is a diagram (step 13) illustrating the process of manufacturing the semiconductor package in accordance with the third embodiment of the invention.

Next, in the step shown in FIG. 37, the external connection terminals 37 are each formed on the wiring 34 exposed in the opening 36x. The external connection terminals 37 are terminals which are electrically connected to pads provided on a mounting substrate (not shown) such as a motherboard. As the external connection terminals 37, it is possible to use, for example, solder bumps or the like. As the material of the external connection terminals 37, it is possible to use, for example, an alloy containing Pb, an alloy of Sn and Cu, an alloy of Sn and Ag, or the like.

Consequently, structures corresponding to the semiconductor packages 30 are respectively formed in the plurality of semiconductor-package forming regions A. It should be noted that the order of the step shown in FIG. 36 and the step shown in FIG. 37 may be switched. Next, in the step shown in FIG. 38, the semiconductor wafer 51 for portions each corresponding to the structure shown in FIG. 37 is cut by dicing or the like along the wafer cutting positions C in the scribing regions B so as to form the semiconductor package 30.

According to the semiconductor package 30 in accordance with the above-described third embodiment of the invention, the solder resist layer 36 is constituted by the inner layer 36a and the outer layer 36b. Further, the inner layer 36a contains the filler 38a with the grain diameter of φ4 smaller than the shortest interval P4 of the wiring 34. As a result, even if a voltage is applied to the semiconductor package 30 in a state in which water has entered from the outside into the inner layer 36a for constituting the solder resist layer 36, and a so-called migration occurs in which a metal such as Cu constituting the wiring 34 is ionized and recrystallized owing to some factor, it is possible to prevent the progress of the migration.

In addition, the outer layer 36b contains the filler 38b with the grain diameter of φ5 equivalent to that in the case of the wiring substrate 100 for constituting the conventional semiconductor package 200. As a result, it is possible to attain the purposes of such as the optimization of the viscosity of the solder resist layer 36, improvement of its printability, improvement of its water resistance, and prevention of the occurrence of cracks.

Although a description has been given above of the preferred embodiments of the invention, the invention is not limited to the above-described embodiments, and various modifications and replacements may be made to the above-described embodiments without departing from the scope of the invention.

For example, in the first embodiment, an example has been shown in which the invention is applied to a wiring substrate having a multilayered wiring layer which does not have a support fabricated by the buildup process. In the second embodiment, an example has been shown in which the invention is applied to a semiconductor package having a multilayered wiring layer which does not have a support fabricated by the buildup process. In the third embodiment, an example has been shown in which the invention is applied to a semiconductor package (so-called chip size package: CSP) of a chip size which is substantially identical to that of a semiconductor chip in a plan view. However, the invention is not limited to them, and may be applied to various wiring substrates and semiconductor packages. For example, the invention may be applied to various wiring substrates including such as a multilayered wiring substrate having a support, a one-sided (one-layered) wiring substrate with the wiring layer formed on only one side thereof, a double-sided (two-layered) wiring substrate with the wiring layer formed on each side of the substrate, a via filling multilayered wiring substrate in which wiring layers are connected by through vias, and an IVH multilayered wiring substrate in which specific wiring layers are connected by interstitial via holes (IVHs), as well as semiconductor packages having these wiring substrates.

In addition, although in the above-described first to third embodiments, an example has been shown in which the solder resist layers are configured as a two-layered configuration, the solder resist layers may be configured by three or more layers. In that case, the insulating layer side is the innermost layer.

In addition, although in the above-described first embodiment an example has been shown in which the wirings are formed by the semi-additive process, the wirings may be formed by various methods such as a subtractive process in addition to the semi-additive process.

What is claimed is:

1. A wiring substrate comprising:
   an insulating layer;
   a wiring formed on the insulating layer; and
   a solder resist layer formed on the insulating layer so as to cover at least a portion of the wiring, the solder resist layer being constituted by a plurality of layers, wherein
   each one of the plurality of layers contains fillers, the fillers in one layer being of different maximum grain diameter than those of the other layers,
   a layer thickness of an innermost layer for constituting the plurality of layers is thicker than a layer thickness of the wiring,
   a maximum grain diameter of the filler contained in the innermost layer is smaller than a shortest interval between adjacent lines of the wiring, and
   the maximum grain diameter of the filler contained in the innermost layer is smaller than the maximum grain diameter of the filler contained in the other layers, and the maximum grain diameter of the filler in at least one of the plurality of layers other than the innermost layer is larger than a shortest interval between adjacent lines of the wiring.

2. The wiring substrate according to claim 1, wherein an amount of the filler contained in the innermost layer is substantially identical to an amount of the filler contained in each of the other layers.

3. The wiring substrate according to claim 1, wherein the innermost layer is free of a secondary aggregation substance of the filler.

4. A semiconductor package comprising:
   the wiring substrate according to claim 1, and
   a semiconductor chip, wherein
   the semiconductor chip is electrically connected to a portion of the wiring of the wiring substrate which is exposed from the solder resist layer.

5. The wiring substrate according to claim 1, wherein the maximum grain diameter of the filler in the innermost layer is determined based on the shortest interval between adjacent lines of the wiring.

6. The wiring substrate according to claim 1, wherein the maximum grain diameter of the filler in the other layers is based on printability, water resistance, and crack prevention.

7. The wiring substrate according to claim 1, wherein the innermost layer of the solder resist layer is formed on the insulating layer to cover a portion of the wiring, and the other layers of the solder resist layer are formed on the innermost layer of the solder resist layer.

8. A semiconductor package comprising:
a semiconductor chip having an electrode thereon; and
a wiring substrate comprising:
   an insulating layer;
   a wiring formed on the insulating layer; and
   a solder resist layer formed on the insulating layer so as to cover at least a portion of the wiring, the solder resist layer being constituted by a plurality of layers, wherein
   each one of the plurality of layers contains fillers, the fillers in one layer being of different maximum grain diameter than those of the other layers,
   a layer thickness of an innermost layer for constituting the plurality of layers is thicker than a layer thickness of the wiring,
   a maximum grain diameter of the filler contained in the innermost layer is smaller than a shortest interval between adjacent lines of the wiring, and
   the maximum grain diameter of the filler contained in the innermost layer is smaller than the maximum grain diameter of the filler contained in the other layers, and the maximum grain diameter of the filler in at least one of the plurality of layers other than the innermost layer is larger than a shortest interval between adjacent lines of the wiring,
further wherein the wiring substrate is formed on the semiconductor chip such that the electrode of the semiconductor chip is electrically connected to the wiring of the wiring substrate.

9. The semiconductor package according to claim 8, wherein
an amount of the filler contained in the innermost layer is substantially identical to an amount of the filler contained in each of the other layers.

10. The semiconductor package according to claim 8, wherein
the innermost layer is free of a secondary aggregation substance of the filler.

11. The semiconductor package according to claim 8, wherein the maximum grain diameter of the filler in the innermost layer is determined based on the shortest interval between adjacent lines of the wiring.

12. The semiconductor package according to claim 8, wherein the maximum grain diameter of the filler in the other layers is based on printability, water resistance, and crack prevention.

13. The semiconductor package according to claim 8, wherein the innermost layer of the solder resist layer is formed on the insulating layer to cover a portion of the wiring, and the other layers of the solder resist layer are formed on the innermost layer of the solder resist layer.

* * * * *